United States Patent
Shin et al.

(10) Patent No.: US 10,686,405 B2
(45) Date of Patent: Jun. 16, 2020

(54) FILM BULK ACOUSTIC RESONATOR OSCILLATORS AND GAS SENSING SYSTEMS USING THE SAME

(71) Applicants: Samsung Electronics Co., Ltd., Suwon-si, Gyeonggi-do (KR); Kwanyoung Oh

(72) Inventors: Eun-seok Shin, Hwaseong-si (KR); Se-ra An, Suwon-si (KR); Jae-jin Park, Seongnam-si (KR); Seung-hoon Lee, Hwaseong-si (KR); Do-hyung Kim, Seoul (KR); Min-young Kang, Gunpo-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 170 days.

(21) Appl. No.: 15/784,660

(22) Filed: Oct. 16, 2017

(65) Prior Publication Data

US 2018/0138859 A1 May 17, 2018

(30) Foreign Application Priority Data

Nov. 16, 2016 (KR) .................. 10-2016-0152960

(51) Int. Cl.
*H03B 1/04* (2006.01)
*G01N 29/44* (2006.01)
(Continued)

(52) U.S. Cl.
CPC .............. *H03B 1/04* (2013.01); *G01N 29/022* (2013.01); *G01N 29/036* (2013.01);
(Continued)

(58) Field of Classification Search
CPC ...... H03B 1/04; H03B 5/1212; H03B 5/1215; H03B 5/30; H03B 5/32; H03B 5/323; H03B 5/326; H03B 5/364; H03H 9/02086; H03H 9/02125; G01N 29/022; G01N 29/036
See application file for complete search history.

(56) References Cited

U.S. PATENT DOCUMENTS

| 5,030,009 A | 7/1991 | Ando et al. |
| 5,936,150 A | 8/1999 | Kobrin et al. |

(Continued)

FOREIGN PATENT DOCUMENTS

| JP | 2675733 B2 | 11/1997 |
| JP | 2001313568 A | 11/2001 |

(Continued)

OTHER PUBLICATIONS

H. Ito et al, A 1.7-GHz 1.5-m W Digitally-Controlled FBAR Oscillator with 0.03-ppb Resolution, 2008 ESSCIRC, pp. 98-101.

*Primary Examiner* — Paul M. West
(74) *Attorney, Agent, or Firm* — Harness, Dickey & Pierce, P.L.C.

(57) ABSTRACT

A resonator oscillator that may be included in a gas sensing system may include an oscillator that may be electrically connected to an external resonator through a conductive line. The oscillator may generate an oscillating signal having a frequency corresponding to a resonance frequency of the external resonator in an oscillating path. A spurious resonance removal circuit on the oscillating path may remove spurious resonance caused by the conductive line from the oscillating path. A gas sensing system may include the oscillator, a resonator that includes a sensor configured to sense a gas, and a frequency counting logic that receives the oscillating signal and a reference clock signal, performs a counting operation on the oscillating signal according to a logic state of the reference clock signal to generate a counted value, and generate a gas sensing output indicating a sensed gas based on the counted value.

10 Claims, 23 Drawing Sheets

(51) Int. Cl.
*H03B 5/36* (2006.01)
*G01N 29/24* (2006.01)
*H03B 5/32* (2006.01)
*G01N 29/32* (2006.01)
*G01N 29/02* (2006.01)
*G01N 29/036* (2006.01)
*H03B 5/24* (2006.01)
*H03H 9/02* (2006.01)
*H03K 21/02* (2006.01)

(52) U.S. Cl.
CPC ......... *G01N 29/2437* (2013.01); *G01N 29/32* (2013.01); *G01N 29/4427* (2013.01); *G01N 29/4463* (2013.01); *H03B 5/24* (2013.01); *H03B 5/326* (2013.01); *H03B 5/364* (2013.01); *H03H 9/02007* (2013.01); *H03K 21/026* (2013.01); *G01N 2291/014* (2013.01); *G01N 2291/021* (2013.01); *G01N 2291/0255* (2013.01); *G01N 2291/0256* (2013.01)

(56) References Cited

U.S. PATENT DOCUMENTS

| | | | |
|---|---|---|---|
| 6,441,763 B1 | 8/2002 | Nakao | |
| 6,467,334 B2 | 10/2002 | Lloyd et al. | |
| 7,511,694 B2 | 3/2009 | Kim et al. | |
| 7,733,190 B2 | 6/2010 | Yajima et al. | |
| 7,737,797 B2 | 6/2010 | Shen | |
| 7,956,779 B2 | 6/2011 | Chen et al. | |
| 8,031,020 B1 | 10/2011 | Tu et al. | |
| 8,134,414 B2 | 3/2012 | McCorquodale et al. | |
| 8,362,809 B2 | 1/2013 | Li et al. | |
| 8,471,633 B2 | 6/2013 | Tsuchi et al. | |
| 8,698,534 B1 | 4/2014 | Huang et al. | |
| 8,907,831 B1 | 12/2014 | Aftab | |
| 8,963,905 B2 | 2/2015 | Cho et al. | |
| 9,071,194 B1 | 6/2015 | Djahanshahi et al. | |
| 9,170,248 B2 | 10/2015 | Fleischer et al. | |
| 9,413,341 B1* | 8/2016 | Ho | H03B 5/364 |
| 2004/0150296 A1 | 8/2004 | Park et al. | |
| 2006/0273866 A1 | 12/2006 | Vilander | |
| 2007/0000305 A1 | 1/2007 | Ma et al. | |
| 2015/0308996 A1 | 10/2015 | Kim et al. | |
| 2016/0294324 A1 | 10/2016 | Rieh et al. | |
| 2016/0301364 A1* | 10/2016 | Ryu | H03B 5/1271 |

FOREIGN PATENT DOCUMENTS

| | | |
|---|---|---|
| KR | 101138487 B1 | 4/2012 |
| KR | 20150134665 A | 12/2015 |
| KR | 20160001369 A | 1/2016 |
| KR | 20160030786 A | 3/2016 |

* cited by examiner

FILM BULK ACOUSTIC RESONATOR OSCILLATORS AND GAS SENSING SYSTEMS USING THE SAME

CROSS-REFERENCE TO RELATED APPLICATIONS

This application claims the benefit of Korean Patent Application No. 10-2016-0152960, filed on Nov. 16, 2016, in the Korean Intellectual Property Office, the disclosure of which is incorporated herein in its entirety by reference.

BACKGROUND

The inventive concepts relate to film bulk acoustic resonator (FBAR) oscillators and gas sensing systems using the same.

An oscillator may include various circuits used for oscillation, together with a resonator. For example, the oscillator may generate an oscillating signal based on various types of resonator. Various types of resonators, such as a crystal type, a ceramic type, and a surface acoustic wave (SAW) type, may be included in the oscillator. As an example of the resonator, an FBAR may have a structure in which a lower electrode, a piezoelectric layer, and an upper electrode are sequentially stacked on each other, and uses a principle in which acoustic waves are generated by a piezoelectric effect when electric energy is applied to the lower and upper electrodes, and thus resonance may be generated.

The FBAR may be connected to a circuit (for example, an amplifier) such that the FBAR may actually generate an oscillating signal through a conductive line. In some cases, a parasitic element (for example, a parasitic inductance) may exist in an electric path through the conductive line. Accordingly, a spurious resonance may be generated, through the conductive line, in a frequency domain other than a resonance frequency, and thus performance of the oscillator may be deteriorated and in addition, performance of a system using the oscillator may be deteriorated.

SUMMARY

The inventive concepts provide a film bulk acoustic resonator (FBAR) oscillator from which spurious resonance is effectively removed, and a gas sensing system using a plurality of the FBAR oscillators having increased implementation efficiency.

According to some example embodiments, an oscillator may be electrically connected to an external resonator through a conductive line. The oscillator may include a first cross-coupled amplifier and a spurious resonance removal circuit. The first cross-coupled amplifier may include a first transistor having a gate connected to a first output terminal of the oscillator and a second transistor having a gate connected to a second output terminal of the oscillator. The first cross-coupled amplifier may be configured to establish an oscillating path. The spurious resonance removal circuit may include at least one circuit device on the oscillating path in the first cross-coupled amplifier. The spurious resonance removal circuit may be configured to remove spurious resonance caused by the conductive line.

According to some example embodiments, a gas sensing system may include an oscillator block and a frequency counting logic. The including oscillator block may include a plurality of oscillators configured to output oscillating signals that oscillate based on a gas being sensed by a sensor, such that frequencies of the oscillating signals are based on the sensed gas. The frequency counting logic may include one or more instances of circuitry. The frequency counting logic may be configured to receive a reference clock signal and the oscillating signals, perform a counting operation on the oscillating signals according to a logic state of the reference clock signal to generate a counted value, and generate a gas sensing output indicating a sensed gas based on the counted value.

According to some example embodiments, a method of operating a gas sensing system may include generating a plurality of oscillating signals, the plurality of oscillating signals oscillating based on a resonance frequency of a plurality of sensors sensing different gases. The method may include performing an operation based on each oscillating signal of the plurality of oscillating signals and a reference clock signal. The method may include outputting, as a gas sensing result, a digital code generated according to a result of performing the operation.

According to some example embodiments, a device may include an oscillator and a spurious resonance removal circuit. The oscillator may be configured to be electrically connected to an external resonator through a conductive line. The oscillator may be configured to generate an oscillating signal having a frequency corresponding to a resonance frequency of the external resonator. The spurious resonance removal circuit may be configured to remove spurious resonance caused by the conductive line from the oscillating signal, such that the frequency of the oscillating signal is within a particular frequency range.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Hereinafter, one or more embodiments will be described with reference to accompanying drawings.

Figure 1:
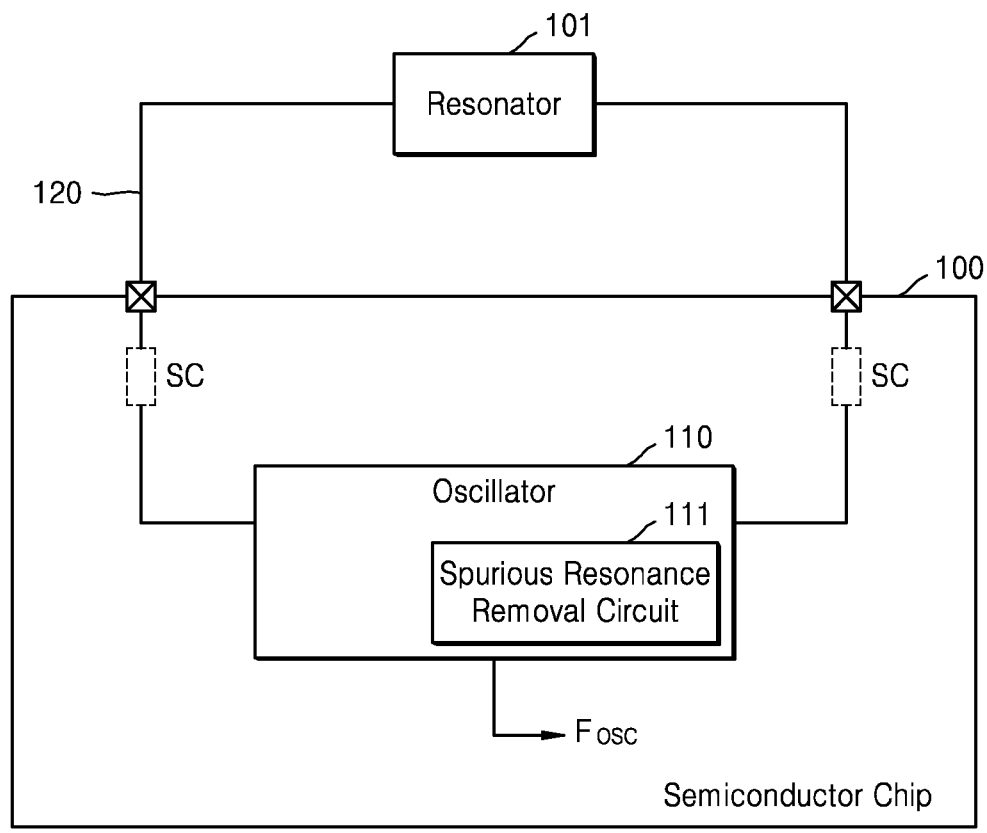
FIG. 1 is a block diagram of an oscillator according to some example embodiments.

FIG. 1 is a block diagram of an oscillator 110 according to some example embodiments.

Referring to FIG. 1, a semiconductor chip 100 may include the oscillator 110, and the oscillator 110 may be electrically connected to a resonator 101 outside the semiconductor chip 100. As referred to herein, such a resonator 101 may be referred to as being external to the semiconductor chip 100. The oscillator 110 may include various structures. For example, the oscillator 110 may include one or more various circuits (for example, an oscillation circuit) configured to generate an oscillating signal having a frequency corresponding to a resonance frequency of ("associated with") the resonator 101. In some example embodiments, the oscillator 110 may include the above-described oscillation circuit together with the resonator 101. In other words, the oscillator 110 may include, in some example embodiments, only the oscillation circuit according to some example embodiments, and the oscillator 110 may include, in some example embodiments, both the oscillation circuit and the resonator 101. In FIG. 1, the resonator 101 is external to the semiconductor chip 100, and thus the oscillator 110 included in the semiconductor chip 100 includes the oscillation circuit generating an oscillation signal based on the outside ("external") resonator 101.

The resonator 101 and the semiconductor chip 100 may be realized ("implemented") via any one of various methods and may be variously defined. For example, the resonator 101 and the semiconductor chip 100 may be realized via different methods on different wafers, or may be realized as chips of various types of levels (for example, a die level and a packaging levels). The resonator 101 may be a chip including at least one resonator realized via a micro-electro mechanical system (MEMS) process. In some example embodiments, the semiconductor chip 100 may include various circuits realized via a complementary metal-oxide semiconductor (CMOS) process, and when the semiconductor chip 100 performs an oscillator function for outputting an oscillating signal, the semiconductor chip 100 may be referred to as an oscillator chip.

According to some example embodiments, the resonator 101 may be realized as a film bulk acoustic resonator (FBAR), and the resonator 101 may have a resonance frequency according to a structure of the FBAR. The FBAR includes a piezoelectric layer (or a piezoelectric thin film) provided between electrodes, wherein the piezoelectric layer is a main element determining resonance characteristics of the FBAR. According to some example embodiments, the resonator 101 may be used as a detecting sensor for detecting various types of gas, and at this time, a certain material (for example, polymer) corresponding to a type of gas to be detected may be coated on the FBAR, and the resonance characteristics of the FBAR may change according to the coated material.

In some example embodiments, the oscillator 110 may output ("generate") an oscillating signal Fosc having a frequency corresponding to the resonance frequency of the resonator 101. If and/or when spurious resonance caused by various components in the resonator 101 and/or the semiconductor chip 100 is not generated, the oscillator 110 may oscillate within a normal ("particular") frequency range (e.g., a particular frequency range defined by one or more particular threshold frequency values), and accordingly, the oscillating signal Fosc having a particular (or, alternatively, desired) frequency inside or outside the semiconductor chip 100 may be generated. In some example embodiments, if and/or when spurious resonance caused by one or more various components is generated, the oscillator 110 may oscillate at an unintended frequency (e.g., the oscillating signal Fosc may have a frequency that exceeds the particular frequency range defined by one or more particular threshold frequency values), and accordingly, performance of the oscillator 110 may deteriorate.

The resonator 101 and the oscillator 110 inside the semiconductor chip 100 are connected to each other through a conductive line 120, which may include a bonding wire. In some example embodiments, various parasitic components SC, such as a parasitic resistance component, a parasitic capacitance component, a parasitic inductance component, some combination thereof, or the like may be generated in an electric path through the conductive line 120. In some example embodiments, the parasitic component SC causing spurious resonance may be modeled to parasitic inductance, and an effect of the parasitic inductance may be offset to remove the spurious resonance.

According to some example embodiments, the oscillator 110 may include at least one cross-coupled amplifier, and the cross-coupled amplifier may include a pair of transistors having a cross-coupled structure, in which respective gates are electrically connected to an output terminal of the other transistor. According to some example embodiments, the oscillator 110 may include a spurious resonance removal circuit (SRRC) 111 configured to remove spurious resonance, wherein the spurious resonance removal circuit 111 may include at least one circuit device configured to offset the effect of parasitic inductance. For example, the spurious resonance removal circuit 111 may include a physical resistor and/or a physical capacitor in the cross-coupled amplifier. In other words, in addition to the circuit devices for realizing the cross-coupled amplifier, the physical resistor and/or the physical capacitor for offsetting the effect of parasitic inductance may be further provided in the cross-coupled amplifier.

According to some example embodiments, the cross-coupled amplifier of the oscillator 110 may include an oscillating path for generating the oscillating signal Fosc, and the spurious resonance removal circuit 111 may be on the oscillating path. According to some example embodiments, the oscillating path may include a path between the gate of one transistor of the pair of transistors in the cross-coupled amplifier and the output terminal of the other transistor, and the spurious resonance removal circuit 111 may include circuit devices connected to the gate of at least one transistor.

According to some example embodiments, if and/or when the spurious resonance removal circuit 111 is in the oscillator 110, the cross-coupled amplifier in the oscillator 110 may be configured to perform low pass filtering, and accordingly, spurious resonance in a high frequency domain may be removed from the oscillating signal generated by the oscillator 110. In other words, spurious resonance may be generated in the high frequency domain due to the parasitic inductance of the electric path (which may include the oscillating path) with the resonator 101, but the spurious resonance may be removed by the spurious resonance removal circuit 111.

According to the example embodiments shown in FIG. 1, spurious resonance caused by the conductive line 120 between the FBAR and a circuit inside the semiconductor chip 100 may be effectively removed from the oscillating signal generated by the oscillator by using the circuit device (e.g., removed by the spurious resonance removal circuit 111) on the oscillating path in the oscillator 110. In other words, physical restrictions may be generated while improving the conductive line 120 so as to reduce a value of a parasitic component, and in addition, an area or implementation costs of the semiconductor chip 100 may increase when a separate inductor is provided so as to offset the parasitic inductance in terms of circuitry. In some example embodiments, according to some example embodiments, the area or implementation costs of the semiconductor chip 100 are reduced and spurious resonance is effectively removed from the oscillating path.

Figure 2A:
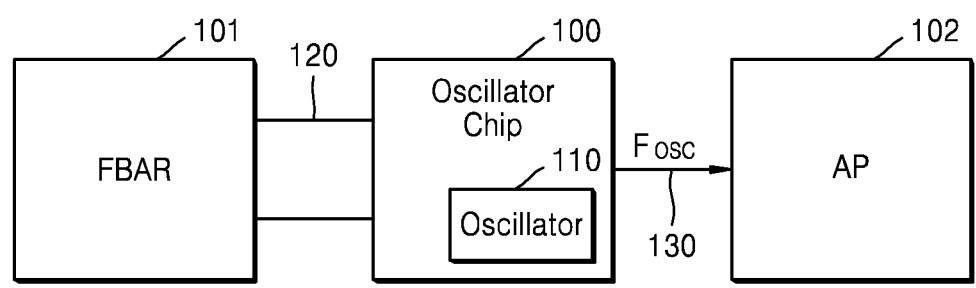
FIGS. 2A and 2B are block diagrams of the oscillator of FIG. 1 according to some example embodiments.
Figure 2B:
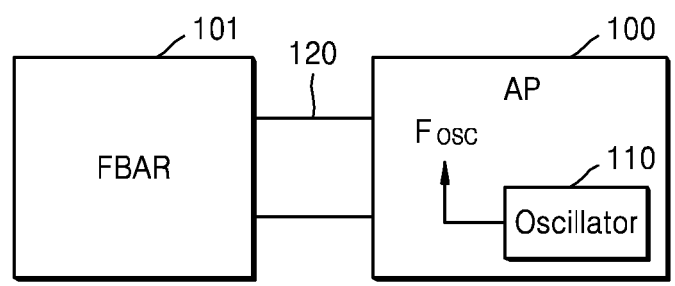

FIGS. 2A and 2B are block diagrams of the oscillator 110 of FIG. 1 according to some example embodiments.

Referring to FIG. 2A, the semiconductor chip 100 including the oscillator 110 may correspond to (e.g., may be included in) an oscillator chip. In other words, the oscillator chip may be connected to an external FBAR, i.e., the resonator 101, realized in a separate chip, via conductive line 120 and may output the oscillating signal Fosc having a frequency corresponding to a resonance frequency of the FBAR via a line (e.g., circuitry, wiring, communication pathway, etc.) 130. For example, the oscillating signal Fosc output from the oscillator 110 may be provided, via line 130, to an application processor (AP) 102 that uses a clock signal of a high frequency.

Referring to FIG. 2B, the semiconductor chip 100 according to some example embodiments may correspond to an AP chip configured to perform various functions based on being installed (e.g., included) in an electronic device. As described herein, an electronic device may include a mobile device, a computer, a handheld device, a smartphone device, some combination thereof, or the like. Various circuits (for example, an oscillation circuit) included in the oscillator 110 may be implemented (e.g., included) in the AP chip, and the various circuits may output the oscillating signal Fosc by being connected to the FBAR that is the resonator 101 via conductive line 120. The oscillating signal Fosc output from the oscillator 110 may be used in the semiconductor chip 100.

Figure 3A:
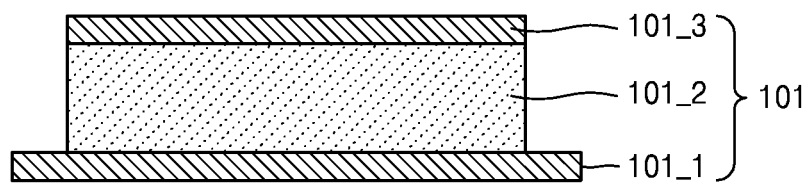
FIGS. 3A and 3B are diagrams of a resonator and a film bulk acoustic resonator (FBAR)-based sensor of FIG. 1, according to some example embodiments.
Figure 3B:
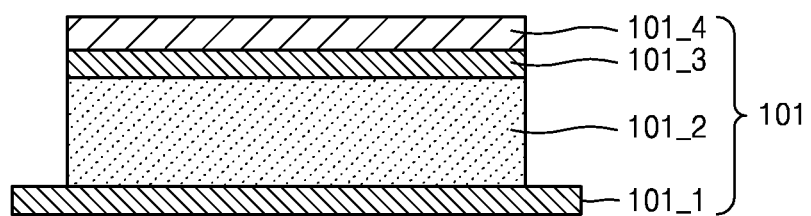

FIGS. 3A and 3B are diagrams of the resonator 101 and a FBAR-based sensor of FIG. 1, according to some example embodiments. Hereinafter, the resonator 101 based on an FBAR may also be referred to as an FBAR, and accordingly, the resonator 101 may be used mixed with the FBAR. Also, an FBAR-based oscillator including an FBAR may also be referred to as an FBAR oscillator. Also, a FBAR-based sensor including an FBAR may also be referred to as an FBAR sensor.

Referring to FIG. 3A, the FBAR may have a structure in which a lower electrode 101_1, a piezoelectric layer 101_2, and an upper electrode 101_3 are sequentially stacked on each other. The piezoelectric layer 101_2 may have a thin-film shape, and may include zinc oxide (ZnO), aluminum nitride (AlN), lead zirconate titanate (PZT), or any one of various types of piezoelectric materials. A resonance frequency of the FBAR may be determined according to (e.g., "based on") a thickness of the piezoelectric layer 101_2, and the FBAR may resonate in a direction in which the lower and upper electrodes 101_1 and 101_3 and the piezoelectric layer 101_2 are stacked on each other, if and/or when a radio frequency (RF) voltage corresponding to the resonance frequency is applied to the lower and upper electrodes 101_1 and 101_3.

Although not illustrated in FIG. 3A for convenience of description, the FBAR may be formed on a silicon or glass substrate, and an insulating layer formed of silicon oxide (SiO2) may be provided between the FBAR and the silicon or glass substrate.

Referring to FIG. 3B, an FBAR sensor is realized. As shown in FIG. 3B, the FBAR sensor may include the lower and upper electrodes 101_1 and 101_3 and the piezoelectric layer 101_2 forming the FBAR as described above, and a sensing layer 101_4 may be coated on the FBAR so as to configure the FBAR sensor to sense or measure a smell or a gas (hereinafter, various sensible targets will be referred to as a gas in a broad sense). If and/or when molecules of a gas or the like are sensed by the FBAR sensor, a resonance frequency of the FBAR is changed, and a frequency of an oscillating signal output from the oscillator 110 is also changed. A gas may be sensed or measured based on detecting the frequency of the oscillating signal. In addition, the FBAR sensor of FIG. 3B may be used as (e.g., included in) any one of various types of sensors, including a mass airflow sensor and an Internet of Things (IoT) sensor.

A receptor of the sensing layer 101_4 may include various types of materials, and according to some example embodiments, the resonance frequency of the FBAR may variously change according to a type of a gas sensed by materials included in the sensing layer 101_4. Also, according to some example embodiments, the resonance frequency of the FBAR may variously change according to concentration of a gas sensed by the sensing layer 101_4. For example, the sensing layer 101_4 may be formed of polymer, and by embodying polymers corresponding to various types of gases to be sensed and coating the polymers on the FBAR, the FBAR sensors capable of sensing various gases may be realized.

A gas sensing system including the FBAR sensor described above may be used as (e.g., included in) an electronic nose system. In other words, the electronic nose system may be configured to sense various types of gases that are harmful to a human body, and may be embodied by using a plurality of FBAR sensors on which polymers each reacting to a certain gas are coated. The electronic nose system based on the FBAR sensor according to some example embodiments may be efficiently installed in a mobile product having a small size.

Figure 4:
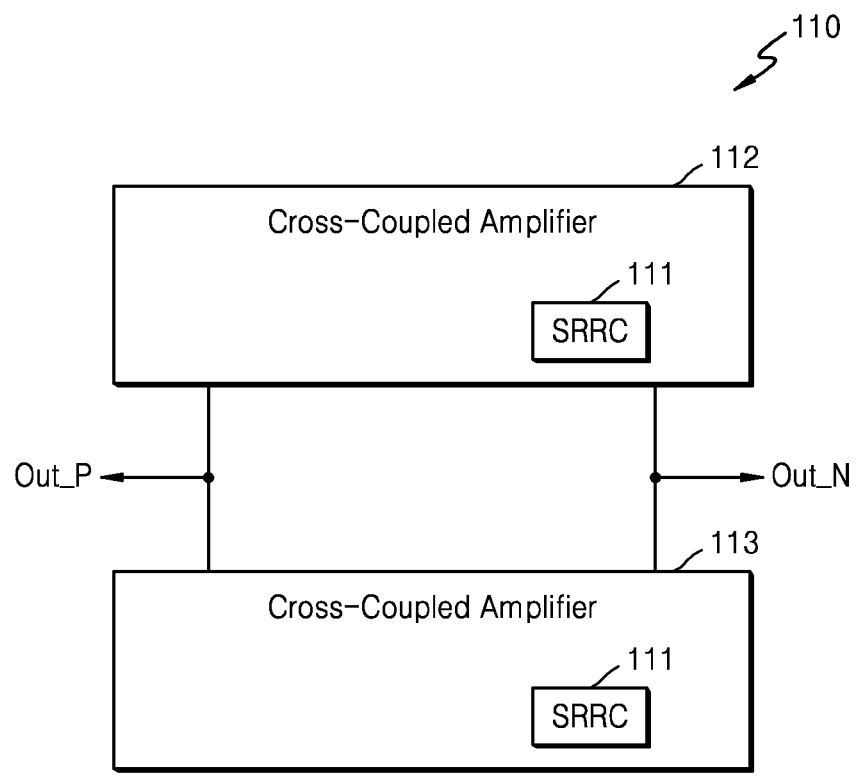
FIG. 4 is a block diagram of the oscillator of FIG. 1 according to some example embodiments.

FIG. 4 is a block diagram of the oscillator 110 of FIG. 1 according to some example embodiments.

Referring to FIGS. 1 and 4, the oscillator 110 may include at least one cross-coupled amplifier, for example, cross-coupled amplifiers 112 and 113, and the spurious resonance removal circuit 111 according to some example embodiments may be included in each of the cross-coupled amplifiers 112 and 113. In FIG. 4, the oscillator 110 may be configured to perform a 2-step amplification operation based on including the two cross-coupled amplifiers 112 and 113, but some example embodiments are not limited thereto. For example, the oscillator 110 may include one cross-coupled amplifier based on an NMOS transistor, or may include one cross-coupled amplifier based on a PMOS transistor.

The oscillator 110 may output the oscillating signal Fosc based on oscillating at a frequency corresponding to a resonance frequency of the resonator 101, and according to some example embodiments, the oscillating signal Fosc may include differential signals having different phases. For example, as shown in FIG. 4, the oscillator 110 may output, as the oscillating signal Fosc, differential signals Out_P and Out_N having opposite phases.

In the example embodiments shown in FIG. 4, each of the cross-coupled amplifiers 112 and 113 includes an individual, respective oscillating path configured to output the oscillating signal Fosc, and according to some example embodiments, the spurious resonance removal circuit 111 may include at least one circuit device on or connected to the oscillating path. According to some example embodiments, the spurious resonance removal circuit 111 may include at least one circuit device configured to offset a signal in a certain frequency domain, and according to some example embodiments, the spurious resonance removal circuit 111 may include at least one of a resistor and a capacitor physically added to the cross-coupled amplifiers 112 and 113, in addition to circuits formed to embody the cross-coupled amplifiers 112 and 113.

Figure 5:
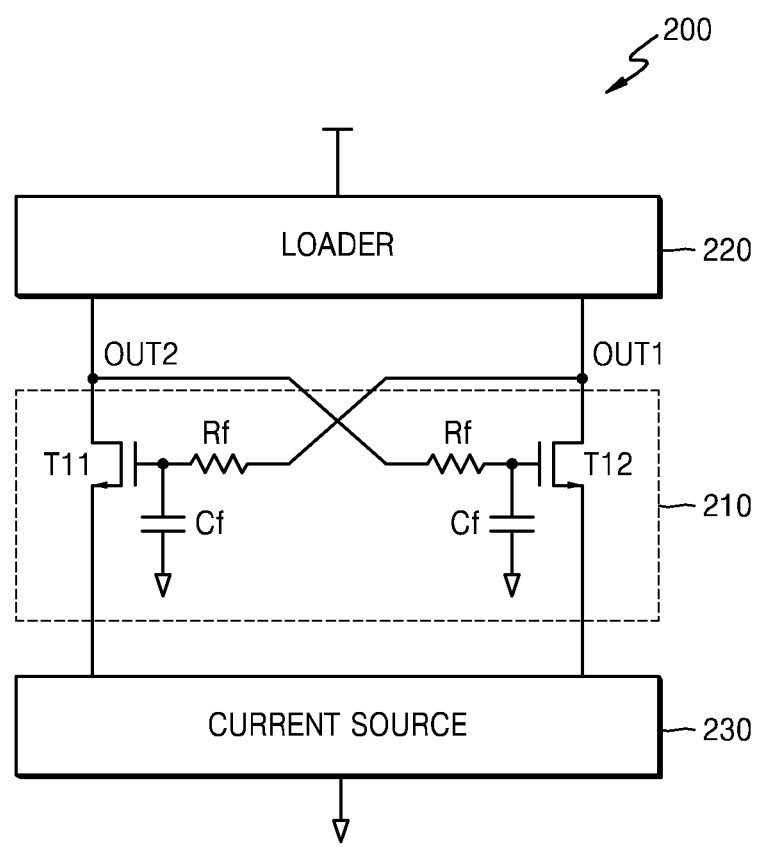
FIG. 5 is a circuit diagram of an oscillator according to some example embodiments.

FIG. 5 is a circuit diagram of a spurious resonance removal circuit included in an oscillator according to some example embodiments.

Referring to FIG. 5, the oscillator 200 is implemented in a semiconductor chip, and may be electrically connected to an external resonator through at least one pad formed on an outer surface of the semiconductor chip. As described above, the external resonator may correspond to an FBAR, parasitic inductance may be generated by a conductive line (for example, a bonding wire) between the FBAR and the oscillator 200, and spurious resonance may be caused by the parasitic inductance.

The oscillator 200 may include various circuits configured to generate an oscillating signal corresponding to a resonance frequency of the external FBAR (e.g., the external resonator). The oscillator may be configured to generate an oscillating signal to have a frequency corresponding to a particular gas sensed by the FBAR (e.g., the external resonator). According to some example embodiments, the oscillator 200 may include a cross-coupled amplifier 210, the cross-coupled amplifier 210 may include at least one transistor (for example, first and second transistors T11 and T12) configured to perform an amplification operation, and each of the first and second transistors T11 and T12 may be an NMOS transistor. A gate of the first transistor T11 may be connected to a first output terminal OUT1 of the oscillator 200, and a gate of the second transistor T12 may be connected to a second output terminal OUT2 of the oscillator 200. Also, the oscillator 200 may further include a current source 230 configured to supply a current to the cross-coupled amplifier 210, and a loader 220 configured to load the oscillator 200.

Also, according to some example embodiments, circuit devices configured to remove spurious resonance may be further included in the oscillator 200. For example, at least one circuit device may be provided in the cross-coupled amplifier 210, and for example, at least one circuit device may be on an oscillating path between the gate of the first transistor T11 and the first output terminal OUT1, and at least one circuit device may be on an oscillating path between the gate of the second transistor T12 and the second output terminal OUT2. Also, for example, resistors Rf may be connected respectively to the gates of the first transistor T11 and the second transistor T12.

A capacitor component in the cross-coupled amplifier 210 may be further configured to remove spurious resonance. For example, capacitors Cf connected to the gates of the first and second transistors T11 and T12 shown in FIG. 4 may correspond to parasitic capacitance components generated in the oscillating paths described above.

In some example embodiments, according to some example embodiments, at least one capacitor Cf may be separately formed, and the capacitor Cf physically formed may be connected to the oscillating path in the cross-coupled amplifier 210. For example, one capacitor Cf may be connected between the gate of the first transistor T11 and the resistor Rf, and another capacitor Cf may be connected between the gate of the second transistor T12 and the resistor Rf.

According to the oscillator 200 shown in FIG. 5, oscillation may be performed at a frequency in which a full phase shift in the oscillator 200 is 0° or 360°. If and/or when a parasitic component by an electric path with the external FBAR is not considered, the full phase shift by the oscillating path in the oscillator 200 may be 0° or 360°. Also, a phase shift is generated by a capacitance or inductance component of the FBAR, a phase shift of the FBAR may be 0° or 360° at a certain frequency, and oscillation may occur at the certain frequency. In some example embodiments, as described above, a phase shift may be generated by a parasitic component by the electric path with the FBAR, and spurious resonance may be generated at an arbitrary frequency higher than the certain frequency.

In some example embodiments, according to arrangements and connections of the circuit devices described above, the resistor Rf and the capacitor Cf are configured to perform a function of a low pass filter (LPF), and a gain may be gradually reduced as a frequency of a signal transmitted through the oscillating path is increased. In other words, spurious resonance at a frequency higher than a resonance frequency caused by parasitic inductance by the external FBAR may be removed, and accordingly, the oscillator 200 may be limited and/or prevented from oscillating at a frequency other than the resonance frequency.

According to some embodiments described above, the oscillator 200 oscillating only in desired frequency components (e.g., oscillating within a particular frequency range) may be implemented by including a spurious resonance removal circuit including the resistor Rf and the capacitor Cf described above. According to some example embodiments, a value of the resistor Rf and/or the capacitor Cf may be determined in consideration of (e.g., may be based on) a quality factor (Q factor) of the oscillator 200, and may be determined such that performance deterioration of the oscillator 200 is reduced within a range in which spurious resonance is removed or reduced.

Figure 6:
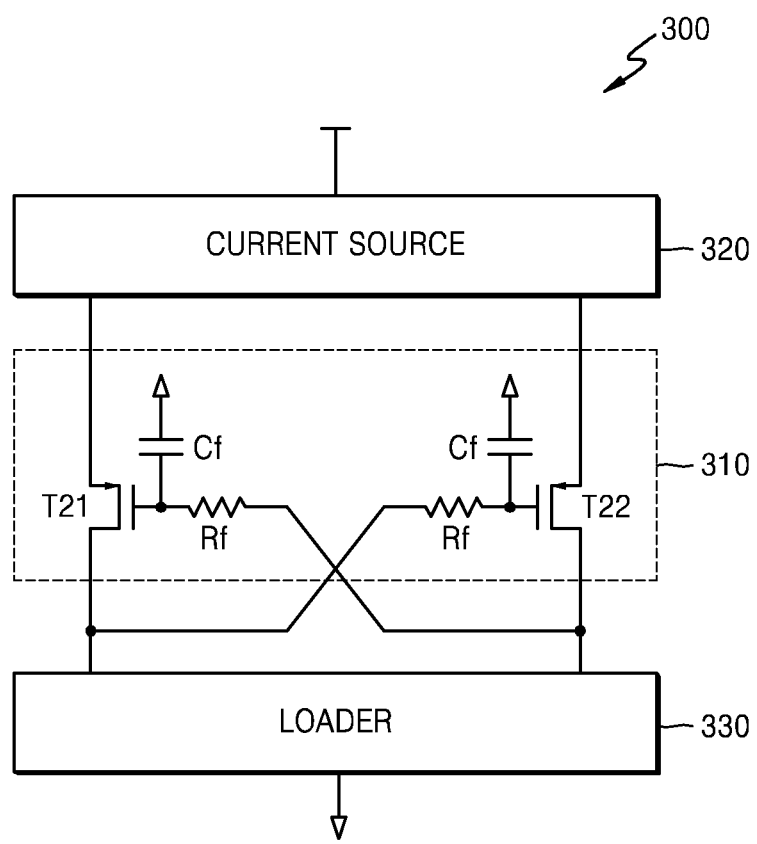
FIG. 6 is a circuit diagram of an oscillator according to some example embodiments.

FIG. 6 is a circuit diagram of an oscillator 300 according to some example embodiments. In FIG. 6, a cross-coupled amplifier 310 includes a PMOS transistor. While describing a structure and operations of the oscillator 300 of FIG. 6, details overlapping those of FIG. 5 are not provided again.

Referring to FIG. 6, the oscillator 300 may include the cross-coupled amplifier 310, a current source 320, a loader 330, and at least one circuit device for removing spurious resonance. The cross-coupled amplifier 310 may include first and second transistors T21 and T22 that are cross-connected, and each of the first and second transistors T21 and T22 may be a PMOS transistor.

Similarly, circuit devices forming the spurious resonance removal circuit may be provided on or connected to an oscillating path in the cross-coupled amplifier 310. For example, the resistor Rf may be connected to each of gates of the first and second transistors T21 and T22, the capacitor Cf may be connected to a node between the gate of the first transistor T21 and the resistor Rf, and the capacitor Cf may be connected to a node between the gate of the second transistor T22 and the resistor Rf. Also, as described above, the resistor Rf may be a physical resistor additionally formed in the cross-coupled amplifier 310. Also, the capacitor Cf may correspond to a parasitic capacitance component formed on the oscillating path, or may be a physical capacitor additionally formed in the cross-coupled amplifier 310.

Figure 7:
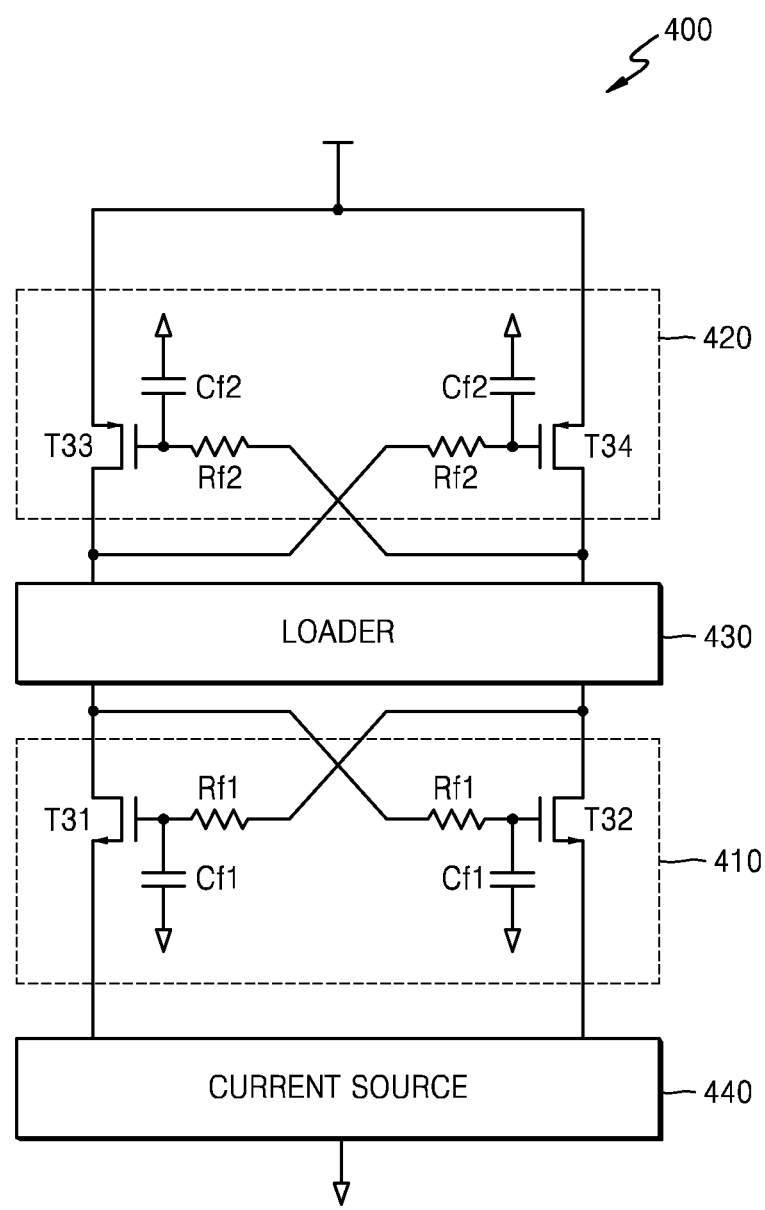
FIG. 7 is a circuit diagram of an oscillator according to some example embodiments.

FIG. 7 is a circuit diagram of an oscillator 400 according to some example embodiments. While describing a structure and operations of the oscillator 400 of FIG. 7, details overlapping those of FIGS. 5 and 6 are not provided again.

Referring to FIG. 7, the oscillator 400 may include a first cross-coupled amplifier 410, a second cross-coupled amplifier 420, a loader 430, and a current source 440. Also, according to some example embodiments described above, the oscillator 400 may further include a spurious resonance removal circuit that includes at least one circuit device included in each of the first and second cross-coupled amplifiers 410 and 420. For example, a resistor Rf1 and a capacitor Cf1 may be connected a gate of a first transistor T31 in the first cross-coupled amplifier 410, and similarly, the resistor Rf1 and the capacitor Cf1 may be connected to a gate of a second transistor T32. Also, a resistor Rf2 and a capacitor Cf2 may be connected to a gate of a third transistor T33 in the second cross-coupled amplifier 420, and similarly, the resistor Rf2 and the capacitor Cf2 may be connected to a gate of a fourth transistor T34.

The first and second transistors T31 and T32 in the first cross-coupled amplifier 410 may be an NMOS transistor, and the third and fourth transistors T33 and T34 in the second cross-coupled amplifier 420 may be a PMOS transistor. Since the oscillator 400 includes two cross-coupled amplifiers, i.e., the first and second cross-coupled amplifiers 410 and 420, including different types of transistors, an output level of the oscillator 400 may be adjusted by simultaneously using transconductance of the NMOS and PMOS transistors.

Figure 8A:
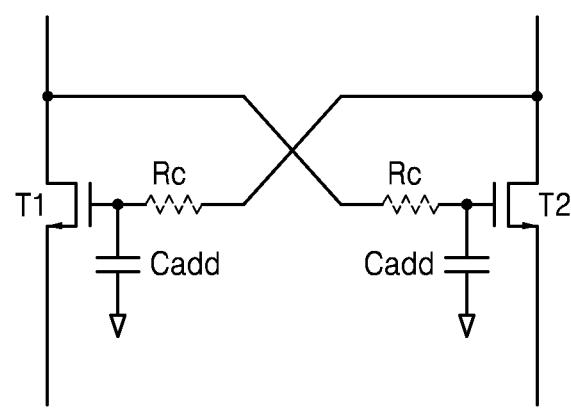
FIGS. 8A and 8B are circuit diagrams of a spurious resonance removal circuit applied to an oscillator, according to some example embodiments.
Figure 8B:
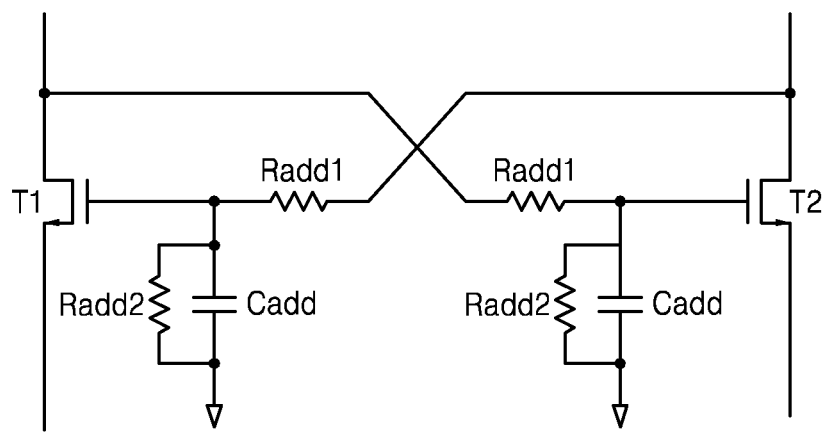

FIGS. 8A and 8B are circuit diagrams of a spurious resonance removal circuit applied to an oscillator, according to some example embodiments.

Referring to FIGS. 8A and 8B, the oscillator may include a cross-coupled amplifier, and the cross-coupled amplifier may include a first transistor T1 and a second transistor T2. A gate of the first transistor T1 may be connected to one electrode (for example, a drain electrode) of the second transistor T2 as a first output terminal of the oscillator, and a gate of the second transistor T2 may be connected to one electrode (for example, a drain electrode) of the first transistor T1 as a second output terminal of the oscillator.

According to some example embodiments described above, a low pass filtering function may be accorded to an oscillating path in the cross-coupled amplifier so as to remove spurious resonance, and the low pass filtering function may be variously performed on the oscillating path. For example, as described above, the low pass filtering function may be performed by using a resistor realized in the cross-coupled amplifier, and a parasitic capacitance component or a capacitor further physically realized, as described above.

In some example embodiments, a spurious resonance removal circuit may be embodied in any one of various forms for performing the above function. For example, as shown in FIG. 8A, the spurious resonance removal circuit may include a capacitor Cadd connected to a parasitic resistance component Rc formed on an oscillating path and a gate of each of the first and second transistors T1 and T2. In other words, by providing the capacitor Cadd having a capacitance value capable of offsetting an effect of parasitic inductance caused by an external FBAR, on the oscillating path, spurious resonance may be removed.

Referring to FIG. 8B, a spurious resonance removal circuit may include a plurality of circuit devices connected each of the first and second transistors T1 and T2. According to some example embodiments, a plurality of resistors Radd1 and Radd2 and the capacitor Cadd may be connected to the gate of the first transistor T1, and a plurality of resistors Radd1 and Radd2 and the capacitor Cadd may be connected to the gate of the second transistor T2. According to some example embodiments, the resistor Radd1 may be provided between the gate of the first transistor T1 and an electrode of the second transistor T2, and the resistor Radd2 may be connected in parallel to the capacitor Cadd. Also, similarly to the above embodiments, a parasitic capacitance component in the oscillating path may be used as the capacitor Cadd, or the capacitor Cadd may be a capacitor physically realized on the oscillating path.

Some example embodiments are not limited to those shown in FIGS. 8A and 8B, and the spurious resonance removal circuit may include various types of circuit devices configured to perform a function of an LPF, and the circuit devices may be variously connected to each other.

Figure 9:
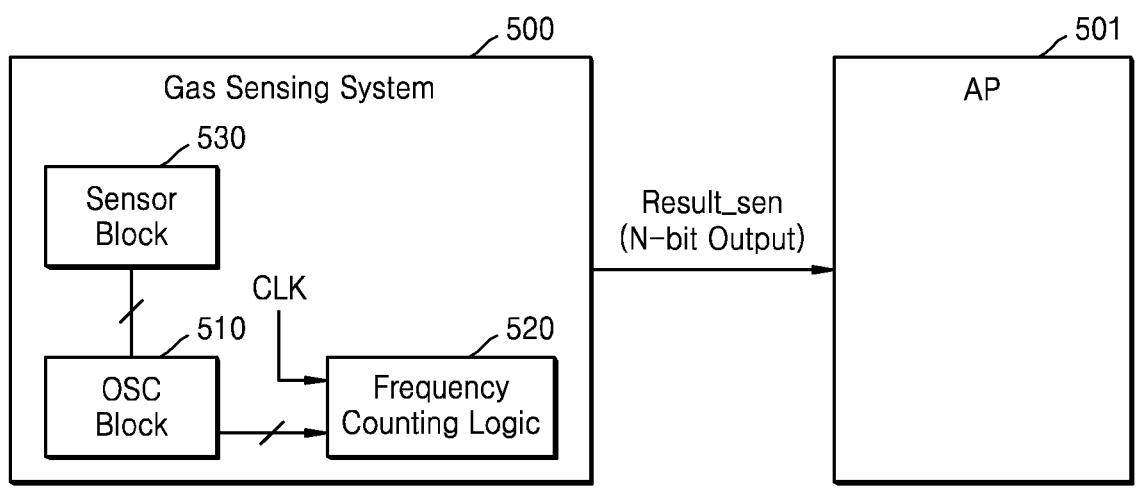
FIG. 9 is a block diagram of a detecting system according to some example embodiments.

FIG. 9 is a block diagram of a detecting system 500 according to some example embodiments.

Referring to FIG. 9, the detecting system 500 may be a gas sensing system configured to sense and measure a smell or a gas. Also, as described above, the gas sensing system may also be referred to as an electronic nose system. Hereinafter, the detecting system 500 will be referred to as the gas sensing system 500.

The gas sensing system 500 may include an oscillator block 510 including at least one oscillator, and a frequency counting logic 520 configured to generate a gas sensing result Result_sen based on a counting operation performed on an oscillating signal generated in the at least one oscillator. Also, the gas sensing system 500 may further include a sensor block 530 including sensors for sensing at least one type of gas.

In FIG. 9, the sensor block 530 may include various types of sensors. According to some example embodiments described above, the sensor block 530 may include FBAR sensors for sensing one or more types of gases. As described above, each FBAR sensor may include an FBAR as a resonator, together with a sensing layer coated on the FBAR. Also, according to some example embodiments, the sensor block 530 may include other various types of resonators, and for example, the sensor block 530 may include various types of resonators, such as a bulk acoustic wave (BAW) resonator, a surface acoustic wave (SAW) resonator, and a solidly mounted resonator (SMR).

According to some example embodiments, the frequency counting logic 520 may generate the gas sensing result Result_sen (also referred to herein as a gas sensing output indicating a sensed gas) based on the counting operation performed on the plurality of oscillating signals from the oscillator block 510. Also, according to some example embodiments, the frequency counting logic 520 may perform the counting operation on the plurality of oscillating signals by using a reference clock signal CLK. The reference clock signal CLK may have a lower frequency than the oscillating signals. Also, according to some example embodiments, the frequency counting logic 520 may count each edge (for example, a rising and/or falling edge) of the oscillating signals during a section of a certain state (for example, logic low or logic high) of the reference clock signal CLK. The counting result may be output as the gas sensing result Result_sen, and for example, the gas sensing result Result_sen may correspond to a digital code N-bit Output having a certain number of bits.

The gas sensing result Result_sen having the digital code N-bit Output may be used by an external device. For example, when the gas sensing system 500 is employed in a mobile device, such as a smart phone, an AP 501 may be included in the mobile device to control overall operations of the mobile device, and the gas sensing result Result_sen from the gas sensing system 500 may be provided to the AP 501. The AP 501 may calculate concentration of sensed gases by performing an operation using the gas sensing result Result_sen. Also, the AP 501 may perform various operations, for example, may output various screens related to gas sensing on a display by processing the gas sensing result Result_sen.

According to some example embodiments, the gas sensing system 500 may be embodied in any one of various forms. For example, various components included in the gas sensing system 500 may correspond to one semiconductor chip implemented on one wafer. In some example embodiments, according to some example embodiments, the gas sensing system 500 may be embodied in at least two semiconductor chips. For example, the sensor block 530 including one or more sensors (for example, FBAR sensors) may be embodied in a separate chip, the oscillator block 510 and the frequency counting logic 520 may be embodied in one semiconductor chip, and the sensor block 530 and the oscillator block 510 may be electrically connected to each other through a conductive line.

According to some example embodiments, an addition process using the digital code N-bit Output may be performed in the gas sensing system 500. For example, various operations, such as operations of calculating concentration of gases, may be performed in the gas sensing system 500.

As described herein, the frequency counting logic may be implemented by one or more instances of circuitry, including a memory storing program instructions and a processor executing the stored program instructions. For example, the memory may include a volatile or non-volatile computer readable storage medium, and the processor may include a CPU, ASIC, some combination thereof, or the like.

Figure 10A:
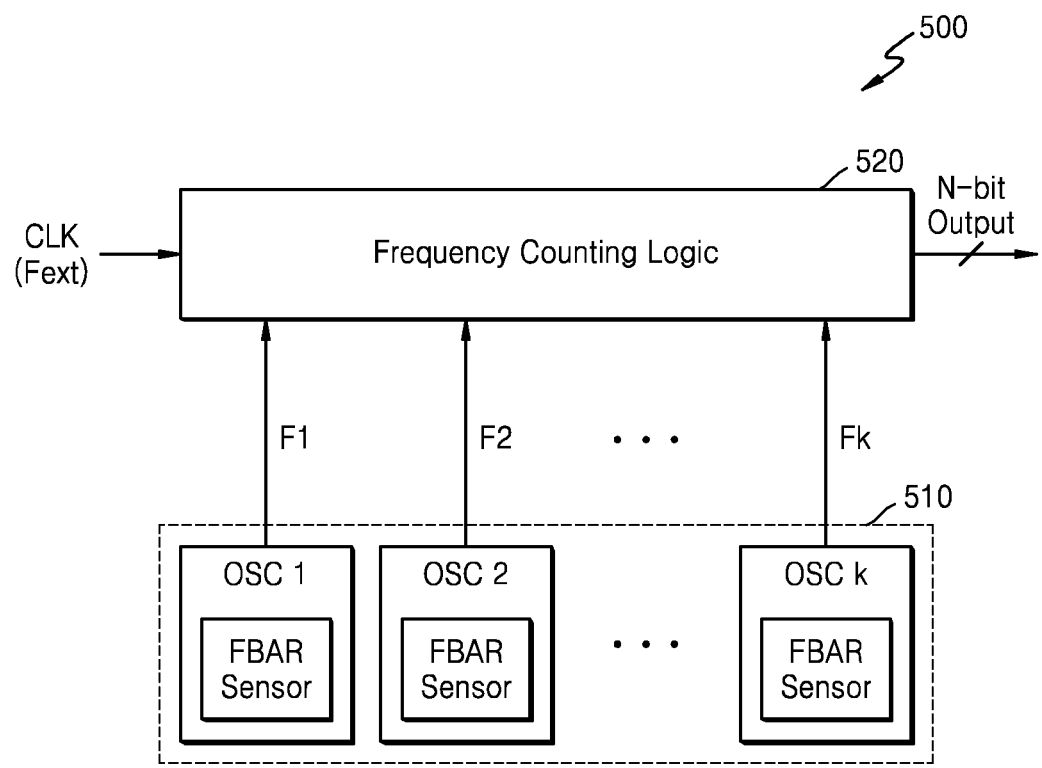
FIGS. 10A and 10B are block diagrams of a gas sensing system of FIG. 9, according to some example embodiments.
Figure 10B:
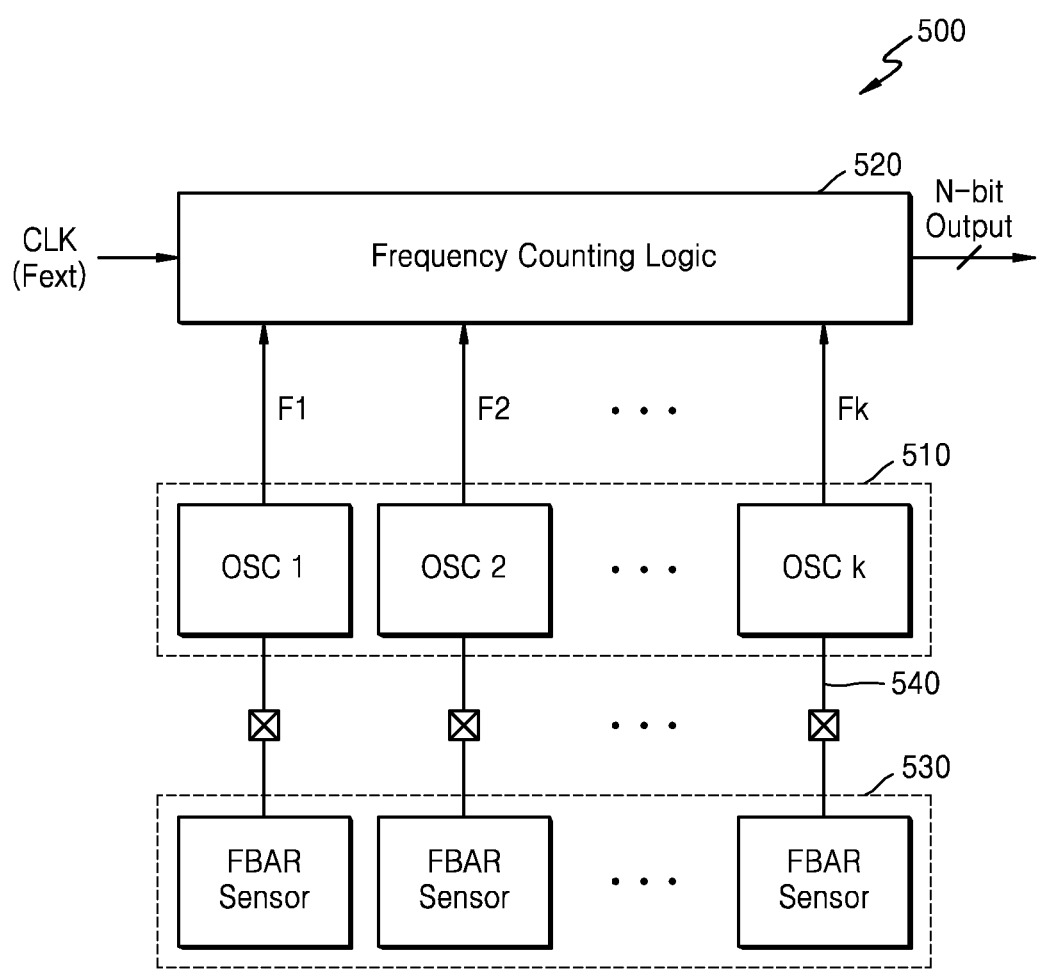

FIGS. 10A and 10B are block diagrams of the gas sensing system 500 of FIG. 9, according to some example embodiments. Hereinafter, an FBAR sensor is shown as a component for gas sensing. Also, a gas sensing result will correspond to an N-bit digital code.

Referring to FIG. 10A, the gas sensing system 500 may include the oscillator block 510 including a plurality of oscillators OSC1 through OSCk, and the frequency counting logic 520 outputting the digital code N-bit Output based on a counting operation performed on oscillating signals F1 through Fk respectively output from the oscillators OSC1 through OSCk. The oscillators OSC1 through OSCk may each correspond to an FBAR-based oscillator described above. Also, each of the oscillators OSC1 through OSCk may include an FBAR sensor described above, and the FBAR sensors of the oscillators OSC1 through OSCk may be coated with different polymers according to characteristics of gases to be sensed.

In FIG. 10A, the FBAR sensors are embodied inside a semiconductor chip, in an on-chip manner. In other words, the sensor block 530 of FIG. 9 may be embodied in the same semiconductor chip as the oscillator block 510. Also, as described above, each of the oscillators OSC1 through OSCk may include a resonator, or may correspond to an oscillation circuit connected to an external resonator. In FIG. 10A, each of the oscillators OSC1 through OSCk includes a resonator.

In some example embodiments, as shown in FIG. 10B, the sensor block 530 including a plurality of FBAR sensors may be embodied as an individual chip separate from a semiconductor chip on which the oscillator block 510 is embodied. Here, the oscillator block 510 and the sensor block 530 may be electrically connected to each other through a conductive unit 540, such as a bonding wire, between pads of the semiconductor chip on which the oscillator block 510 is embodied and pads of the semiconductor chip on which the sensor block 530 is embodied. For example, the oscillators OSC1 through OSCk may be connected to the FBAR sensors in a one-to-one manner.

Each of the plurality of FBAR sensors may have an intrinsic resonance frequency. For example, one FBAR sensor may have a resonance frequency according to a piezoelectric layer and a sensing layer, and when gas molecules to be sensed are combined by the sensing layer, the resonance frequency may change. Accordingly, by analyzing frequencies of the oscillating signals F1 through Fk respectively from the oscillators OSC1 through OSCk, various types of gases may be sensed and measured.

According to some example embodiments, the FBAR sensors may have the same resonance frequency based on an environment in which a gas is not sensed. Also, when each FBAR sensor senses a corresponding gas, the resonance frequency of each FBAR sensor may change. A type of a gas sensed by each sensor may be a particular (or, alternatively, predetermined), and various types of gases may be sensed and measured by analyzing frequency changes of the oscillating signals F1 through Fk respectively from the oscillators OSC1 through OSCk according to changes of the resonance frequencies.

In some example embodiments, the FBAR sensors may be different resonance frequencies based on an environment in which a gas is not sensed. As described above, various types of gases may be sensed and measured by analyzing the frequency changes of the oscillating signals F1 through Fk respectively from the oscillators OSC1 through OSCk, and at this time, a type of a gas sensed by each FBAR sensor may also be determined through ranges of frequencies of the oscillating signals F1 through Fk.

Meanwhile, the frequency counting logic 520 may generate the gas sensing result, i.e., the digital code N-bit Output, by performing a logic process on the reference clock signal CLK and the oscillating signals F1 through Fk from the oscillator block 510. Various functions of the frequency counting logic 520 may be implemented in hardware circuits performing the logic process, or may be implemented in terms of software when a processor executes programs stored in a working memory (not shown). Here, the frequency counting logic 520 may include the processor and/or the working memory. In some example embodiments, some of the various functions of the frequency counting logic 520 may be implemented in terms of hardware, and the remaining of the various functions may be implemented in terms of software.

According to some embodiments, only one reference clock signal CLK may be used to generate the digital codes N-bit Output of various types of gases by processing the oscillating signals F1 through Fk. Also, since the digital code N-bit Output may be generated by using the reference clock signal CLK having a relatively low frequency, a circuit for a process, such as high speed frequency comparison, is not required, and accordingly, power consumption may be reduced in system implementation and in addition, an area increase may be reduced.

Meanwhile, in FIGS. 10A and 10B, the reference clock signal CLK may be generated by a clock generator (not shown) in a semiconductor chip employing the gas sensing system 500. In some example embodiments, the reference clock signal CLK may be generated by a unit outside the semiconductor chip employing the gas sensing system 500, and provided to the gas sensing system 500.

Hereinafter, operations of the gas sensing system 500 will be described above. As described above, an arrangement of an FBAR sensor may vary, and in following embodiments, it is assumed that the FBAR sensor is disposed outside a semiconductor chip.

Figure 11:
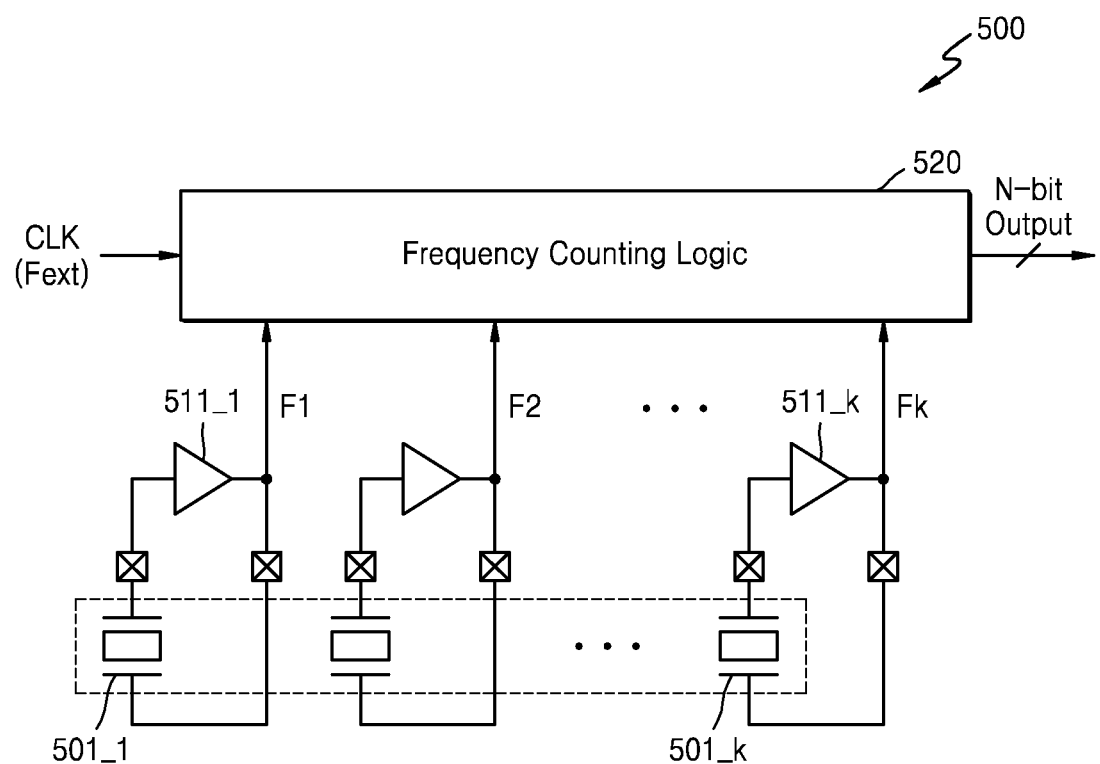
FIGS. 11 and 12 are circuit diagrams of the gas sensing system of FIG. 9, according to some example embodiments.
Figure 12:
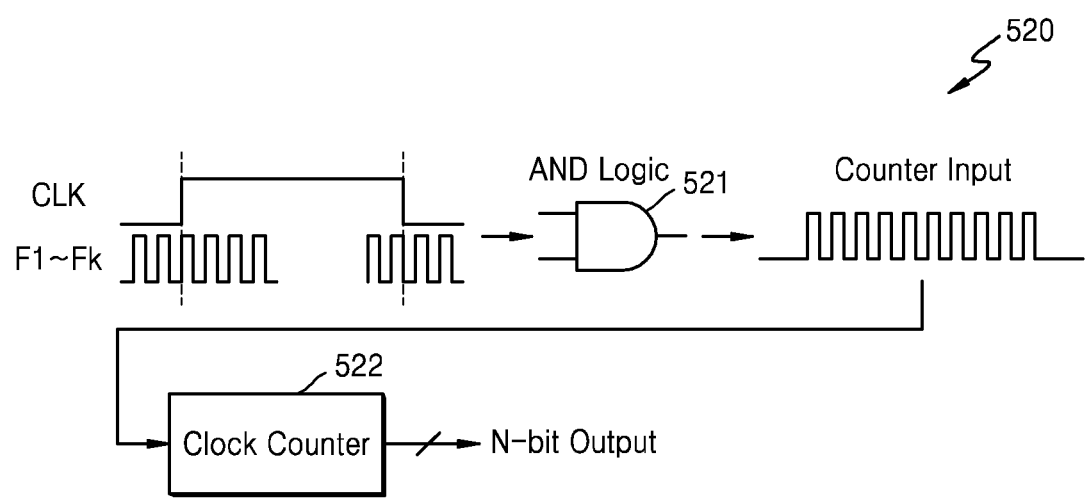

FIGS. 11 and 12 are circuit diagrams of the gas sensing system 500 of FIG. 9, according to some example embodiments.

Referring to FIG. 11, first through k-th oscillators 511_1 through 511_k in the gas sensing system 500 may be respectively electrically connected to resonators 501_1 through 501_k through a pad of a semiconductor chip included in the gas sensing system 500. The resonators 501_1 through 501_k have intrinsic resonance frequencies that change when a gas is sensed. The first through k-th oscillators 511_1 through 511_k may respectively output the oscillating signals F1 through Fk having frequencies that change according to the changes of the resonance frequencies of the first through k-th oscillators 511_1 through 511_k.

Meanwhile, referring to FIG. 12, the frequency counting logic 520 may include at least one logic device and at least one counter. For example, in FIG. 12, the frequency counting logic 520 has a structure shared with the first through k-th oscillators 511_1 through 511_k, and thus includes one logic device 521 and one clock counter 522. Also, for example, the logic device 521 may include an AND logic ("AND operator") performing an AND operation on the reference clock signal CLK and each of the oscillating signals F1 through Fk. Also, the clock counter 522 may generate a gas sensing result, i.e., the digital code N-bit Output described above, by counting a clock of a signal output from the logic device 521.

According to an example of the first oscillator 511_1, the first oscillator 511_1 may output the oscillating signal F1 having a frequency difference of ΔF when a first type of gas is sensed and when not sensed. Also, a value of ΔF corresponding to the frequency difference may change according to concentration of the sensed gas.

The logic device 521 performs an AND operation on the reference clock signal CLK and the oscillating signal F1, and may output a signal in which toggling is activated when the reference clock signal CLK is logic high (H). According to some example embodiments, a section where toggling is activated may change by changing a frequency of the reference clock signal CLK. For example, when the frequency of the reference clock signal CLK is low, the section where toggling is activated may be long. An output of the logic device 521 is provided as a counter input of the clock counter 522, and a frequency of a clock in a section where toggling of the counter input is activated may correspond to the frequency of the oscillating signal F1.

The clock counter 522 may receive the counter input corresponding to the output of the logic device 521, and count the number of rising and/or falling edges of the cock. The counted number of rising and/or falling edges may be proportional to the value of F1/Fext. For example, when the numbers of rising and falling edges of the clock are counted together, the counted numbers may correspond to the value of F1/Fext. An N-bit digital code may be generated according to the counted numbers, and the N-bit digital code may be output as a gas sensing result, i.e., the digital code N-bit Output. Also, by analyzing the digital code N-bit Output, a frequency value relative to the frequency Fext of the reference clock signal CLK may be determined. For example, since the frequency Fext of the reference clock signal CLK may have a pre-set value, a frequency of the oscillating signal F1 may be determined by analyzing the digital output N-bit Output.

The counting operation may be performed in any one of various manners. For example, in FIG. 12, a clock is counted within one cycle of the reference clock signal CLK, but the clock may be counted within two or more cycles of the reference clock signal CLK. For example, when a counting section of the clock increases, the number of errors of the digital code N-bit Output may be decreased. Also, in the above example, the numbers of rising and falling edges of a clock are both counted, but in some example embodiments, only the number of rising or falling edges of the clock may be counted.

Similarly, the oscillating signals F2 through Fk of the second through k-th oscillators 511_2 through 511_k are provided to the frequency counting logic 520, and the digital code N-bit Output corresponding to each of the oscillating signals F2 through Fk may be generated. For example, frequencies of the oscillating signals F2 through Fk may be determined through the digital codes N-bit Output respectively corresponding to the oscillating signals F2 through Fk, and accordingly, various types of gases may be sensed or measured.

According to above embodiments, only simple logic devices and clock counters may be provided according to the first through k-th oscillators 511_1 through 511_k and desired gas sensing results are easily generated in digital codes, and thus the gas sensing system 500 may have low power consumption and small area.

Figure 13:
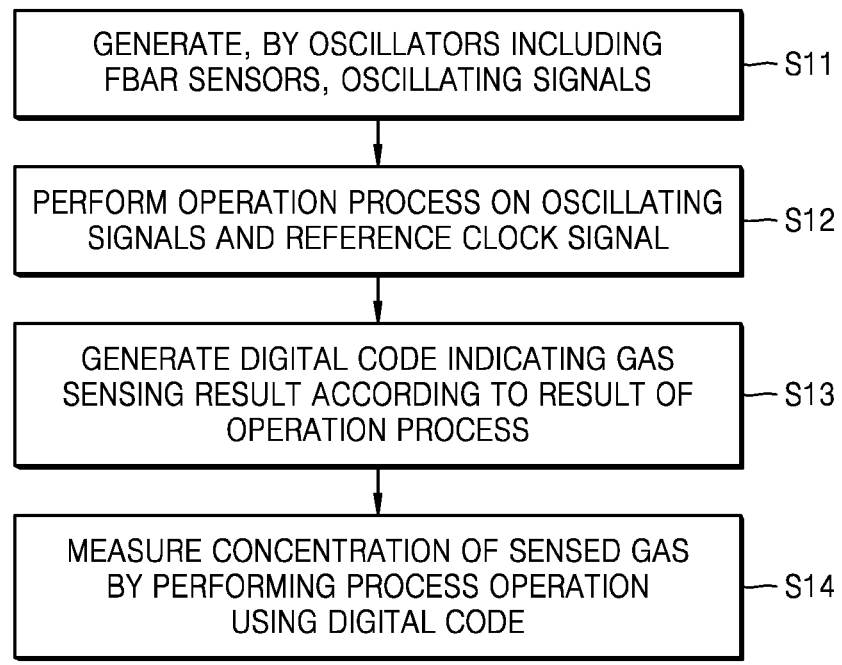
FIG. 13 is a flowchart of a method of operating a gas sensing system and a device including the gas sensing system, according to some example embodiments.

FIG. 13 is a flowchart of a method of operating a gas sensing system and a device including the gas sensing system, according to some example embodiments. The method shown in FIG. 13 may be implemented by one or more portions of a gas sensing system as described herein.

Referring to FIG. 13, the gas sensing system may include a plurality of oscillators, and each oscillator may include an FBAR sensor having an intrinsic resonance frequency. The oscillators may generate oscillating signals indicating results of sensing different types of gases, in operation S11, according to characteristics of polymers included in the FBAR sensors.

A reference clock signal may be used to determine frequencies of the oscillating signals. According to some example embodiments, the reference clock signal may have a frequency lower than those of the oscillating signals, and an operation process using the reference clock signal may be performed on each of the oscillating signals generated by the oscillators, in operation S12. Various operation processes may be performed by using the oscillating signals and the reference clock signal, and as described above, an AND operation may be performed on the oscillating signals and the reference clock signal, and a counting operation for counting the number of edges of a signal (for example, a counter input) output as a result of the AND operation may be performed.

A digital code indicating a gas sensing result may be generated according to a result of the counting operation, in operation S13. The digital code may include a value related to a ratio of a frequency of the oscillating signal to a frequency of the reference clock signal, and the gas sensing system may output the gas sensing result corresponding to the digital code.

The gas sensing result output by the gas sensing system may be variously used, and according to some example embodiments, the gas sensing result may be provided to a semiconductor chip, such as an AP, in the device employing the gas sensing system. The AP may perform various functions related to gas sensing by performing process operations using the digital code, and according to some example embodiments, concentration of a sensed gas may be measured, in operation S14.

Figure 14A:
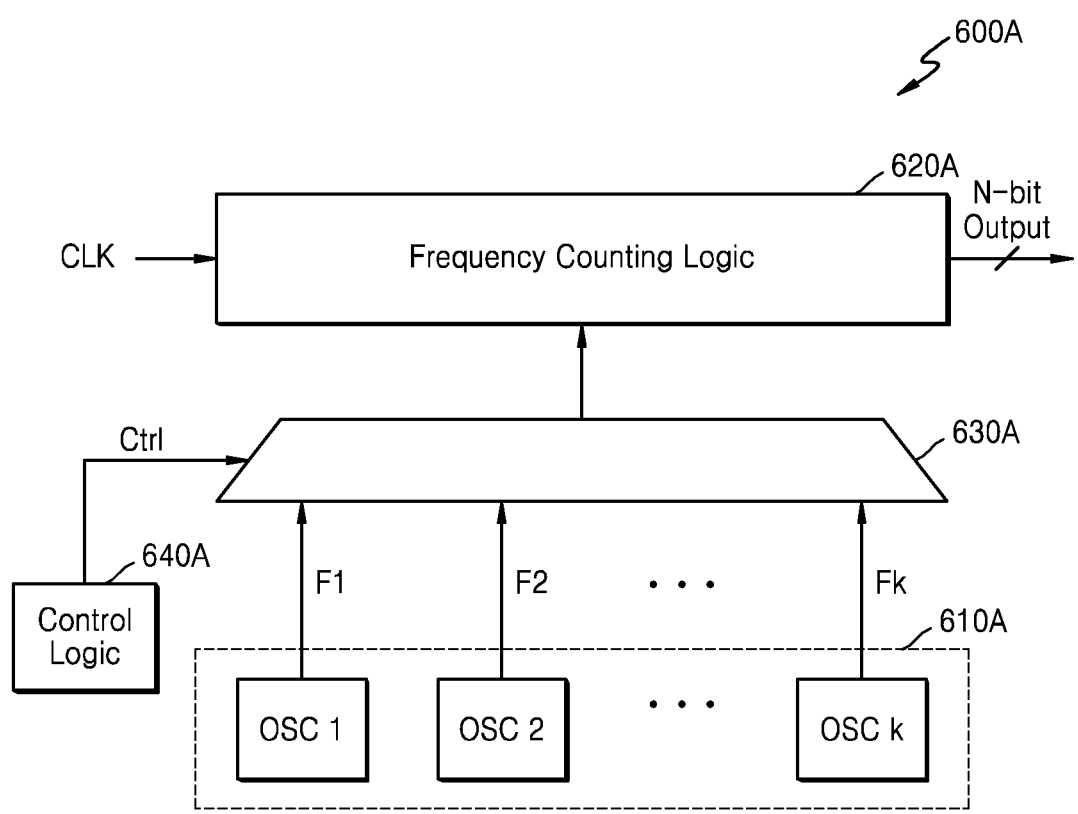
FIGS. 14A and 14B are block diagrams of gas sensing systems according to some example embodiments.
Figure 14B:
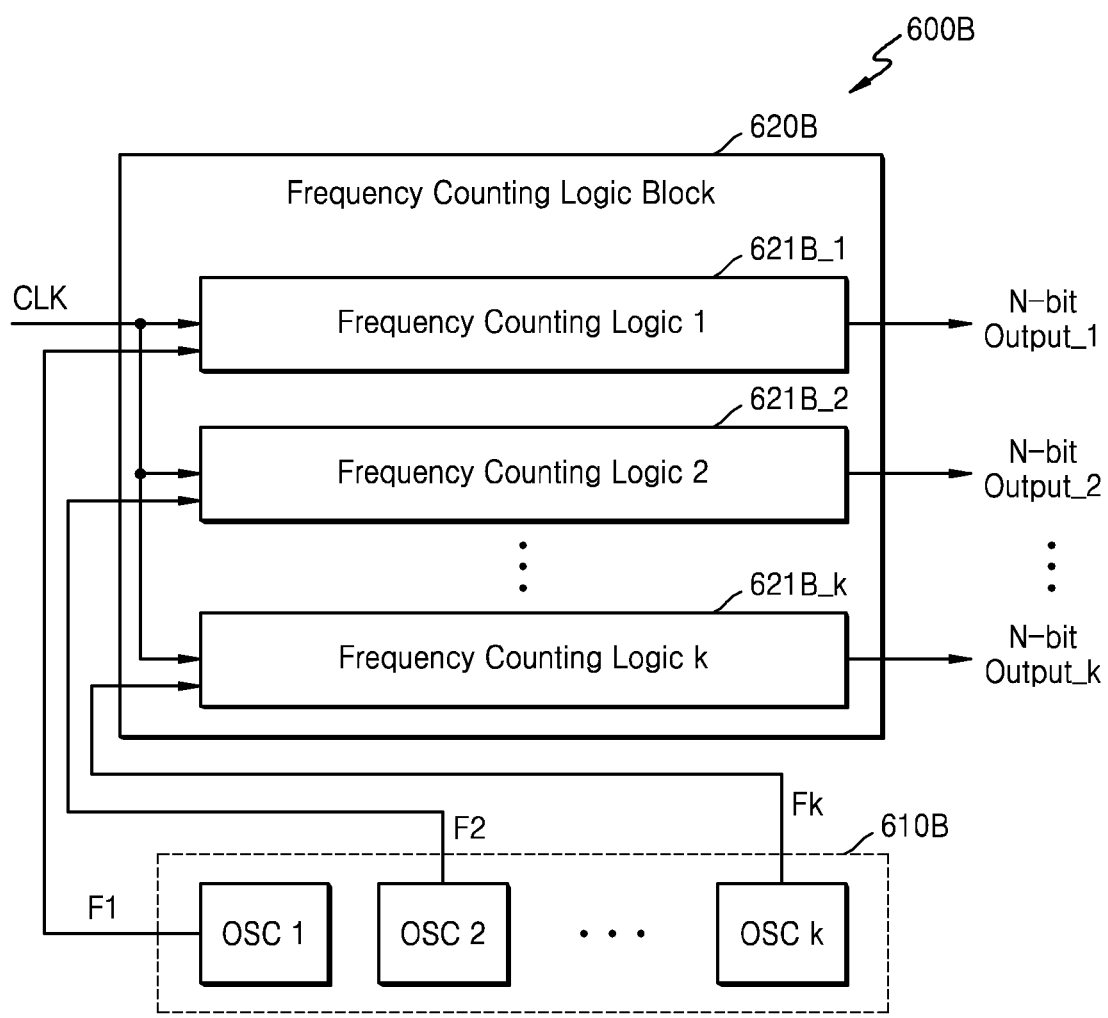

FIGS. 14A and 14B are block diagrams of gas sensing system 600A and 600B according to some example embodiments. Although not shown in FIGS. 14A and 14B, an FBAR may be included in an oscillator or an external FBAR may be electrically connected to an oscillator.

Referring to FIG. 14A, the gas sensing system 600A may include an oscillator block 610A including a plurality of oscillators OSC1 through OSCk, and a frequency counting logic 620A performing a counting operation on the oscillating signals F1 through Fk. Also, the gas sensing system 600A may further include a selector 630A receiving the oscillating signals F1 through Fk from the oscillator block 610A and selectively outputting one of the oscillating signals F1 through Fk, and a control logic 640A providing a control signal ctrl to the selector 630A.

In FIG. 14A, the frequency counting logic 620A may be shared by the oscillators OSC1 through OSCk. In other words, the frequency counting logic 620A may be used by the oscillators OSC1 through OSCk via time-division, and the selector 630A may sequentially provide the oscillating signals F1 through Fk to the frequency counting logic 620A in response to the control signal ctrl. Also, the frequency counting logic 620A may generate a gas sensing result, i.e., the digital code N-bit Output by performing logic processes, such as an AND operation and a counting operation, on the reference clock signal CLK and the oscillating signals F1 through Fk. Also, a plurality of the digital codes N-bit Output may be sequentially generated by a plurality of sensors (for example, FBAR sensors).

Meanwhile, in FIG. 14B, a frequency counting logic is individually provided according to the oscillators OSC1 through OSCk. Referring to FIG. 14B, the gas sensing system 600B may include an oscillator block 610B including the oscillators OCS1 through OSCk, and a frequency counting logic block 620B including a plurality of first through k-th frequency counting logics 621B_1 through 621B_k. The reference clock signal CLK may be commonly provided to the first through k-th frequency counting logics 621B_1 through 621B_k in the frequency counting logic block 620B. Also, the oscillating signals F1 through Fk from the oscillators OSC1 through OSCk may be respectively provided to the first through k-th frequency counting logics 621B_1 through 621B_k.

Each of the frequency counting logics 621B_1 through 621B_k may generate the digital code N-bit Output corresponding to a gas sensing result in the same or similar manner as the above embodiments. For example, the first frequency counting logic 621B_1 may generate a first gas sensing result N-bit Output_1 indicating a result of sensing a first type of gas, and the k-th frequency counting logic 621B_k may generate a k-th gas sensing result N-bit Output_k indicating a result of sensing a k-th type of gas. Also, the first through k-th gas sensing results N-bit Output_1 through N-bit Output_K from the frequency counting logic block 620B may be output in parallel.

As described above, the frequency counting logic 620A may be implemented by one or more instances of circuity. In some example embodiments, the control logic 640A may be implemented by one or more instances of circuitry, including a processor executing programs of instruction stored on a memory. For example, the memory may include a volatile or non-volatile computer readable storage medium, and the processor may include a CPU, ASIC, some combination thereof, or the like.

Figure 15:
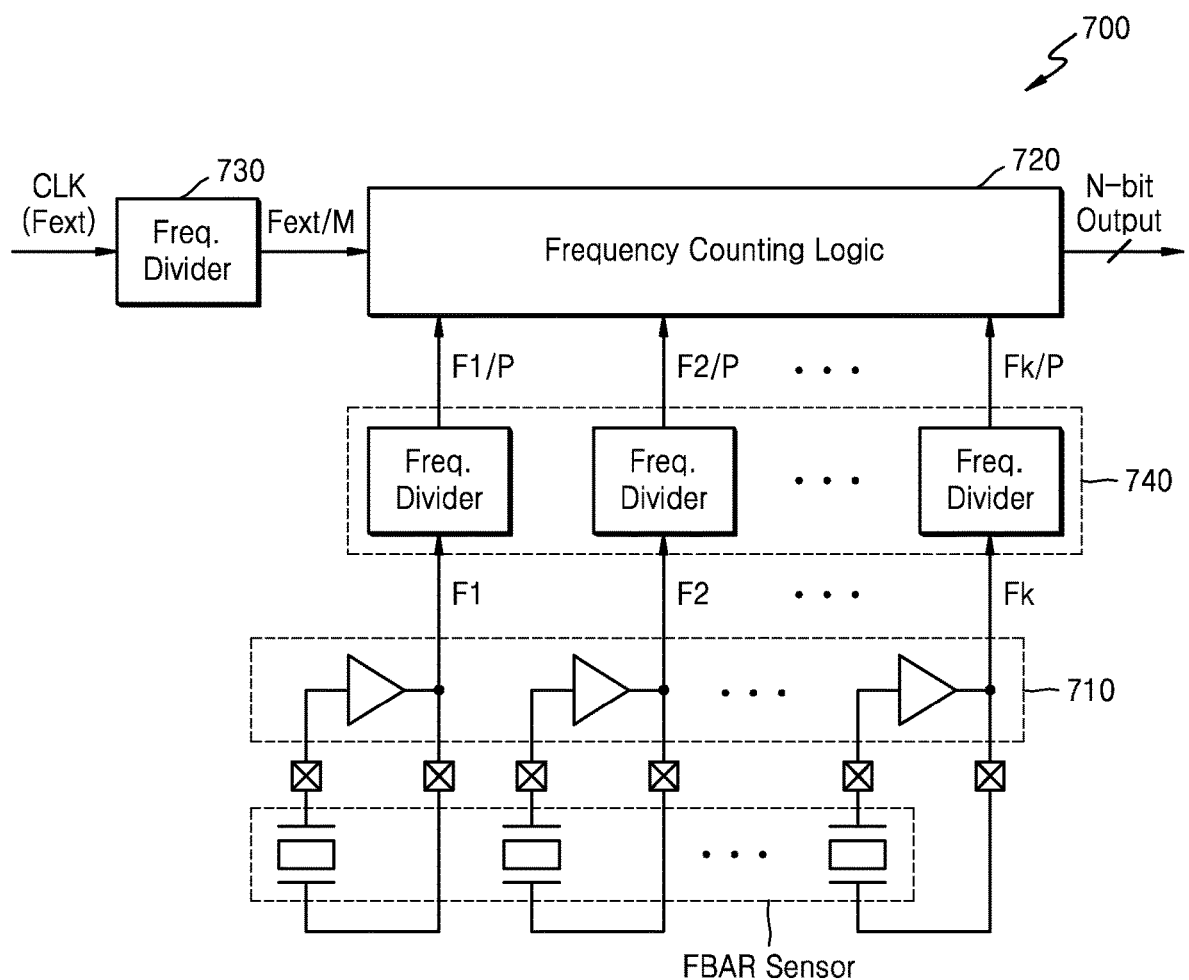
FIGS. 15 through 17 are block diagrams of a gas sensing system according to some example embodiments.
Figure 16:
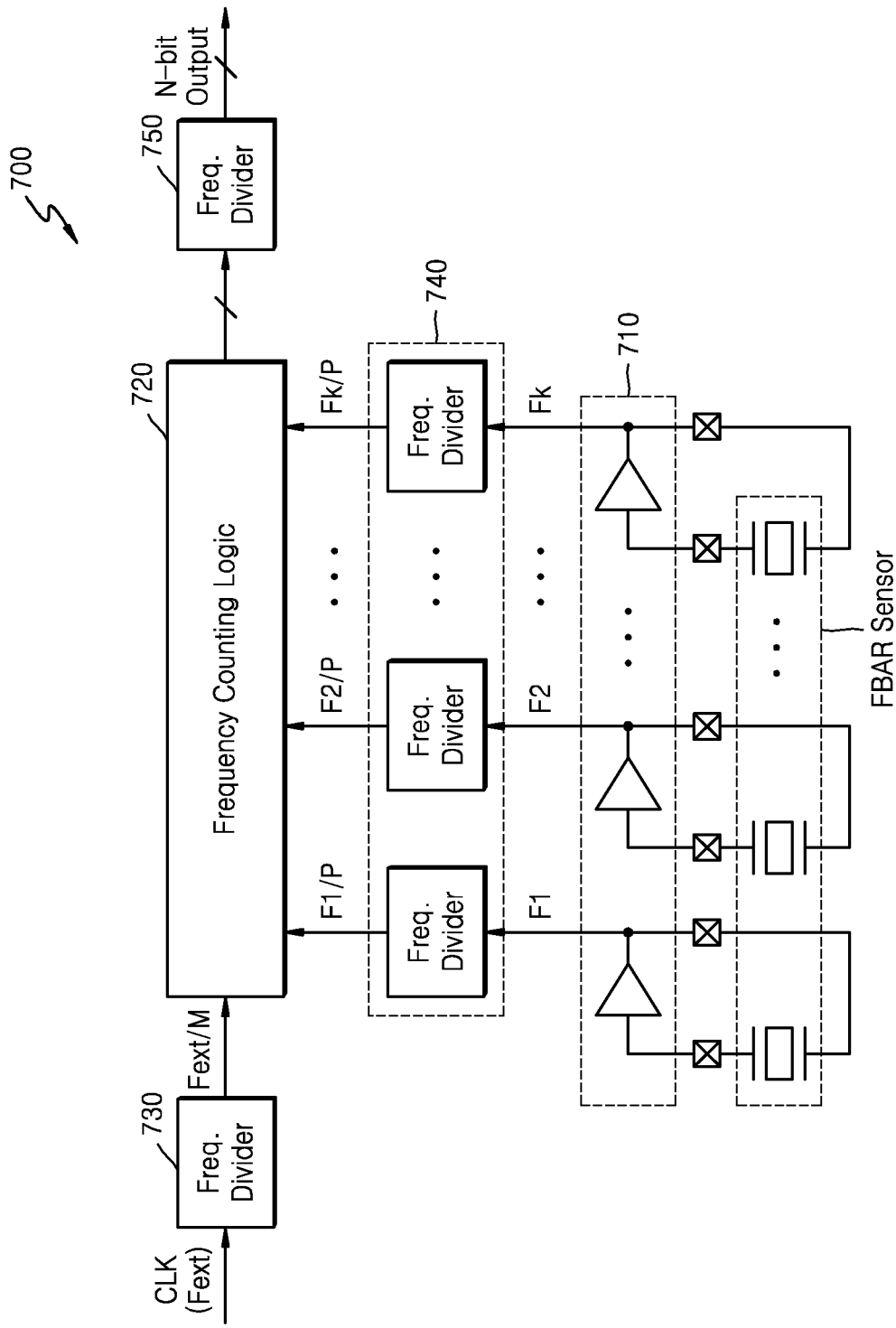
Figure 17:
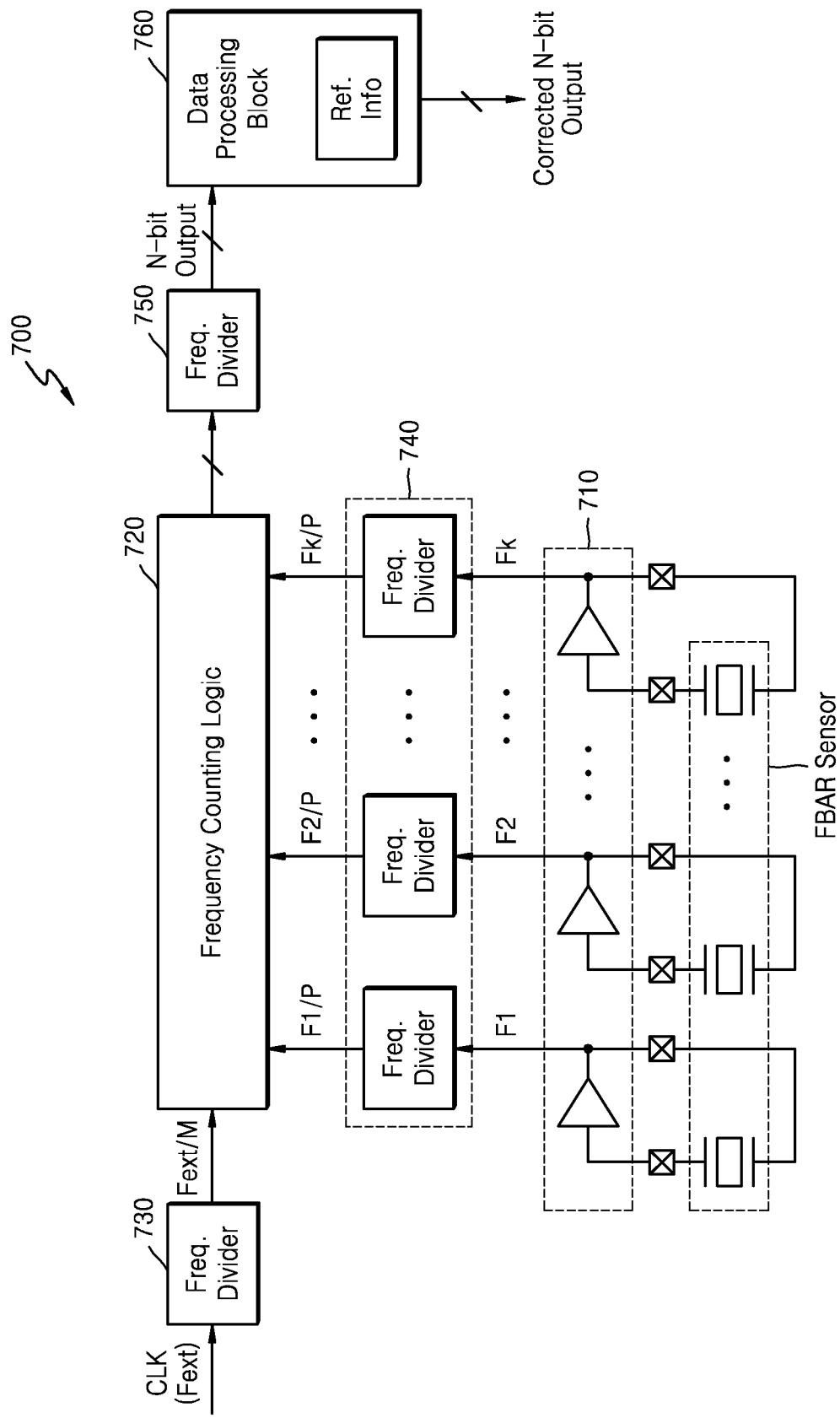

FIGS. 15 through 17 are block diagrams of a gas sensing system 700 according to some example embodiments.

Referring to FIG. 15, the gas sensing system 700 may include an oscillator block 710 including the oscillators OSC1 through OSCk, and a frequency counting logic 720 performing a counting operation on the oscillating signals F1 through Fk. Here, when various clock signals used by the gas sensing system 700 have high frequencies, a processing load may increase, for example, power consumption for processing the clock signals having high frequencies may increase, and in this regard, the gas sensing system 700 may further include at least one divider so as to reduce the processing load. According to some example embodiments, the gas sensing system 700 may further include a frequency divider 730 that divides the reference clock signal CLK and provides the divided reference clock signal CLK to the frequency counting logic 720, and a divider block 740 including a plurality of frequency dividers for dividing the oscillating signals F1 through Fk. Restated, at least one frequency divider may receive the reference clock signal CLK, divide the received reference clock signal by N, where N is an integer of at least 2, and output the divided reference clock signal to a frequency counting logic 720. Each of the plurality of frequency dividers shown in FIG. 15 may perform a frequency dividing operation using at least one flip-flop. Each of the frequency dividers included in the divider block 740 may be implemented by one or more instances of circuitry, including a processor executing a program of instructions stored in a memory. For example, the memory may include a volatile or non-volatile computer readable storage medium, and the processor may include a CPU, ASIC, some combination thereof, or the like.

According to the frequency dividing operation, the frequency of the reference clock signal CLK provided to the frequency counting logic 720 may be divided by 1/M. Restated, at least one frequency divider may receive oscillating signals from one or more oscillators, divide the received oscillating signals by M, where M is an integer of at least 2, and output the divided oscillating signals to a frequency counting logic 720. Also, the frequency of each of the oscillating signals F1 through Fk provided to the frequency counting logic 720 may be divided by 1/P. Here, a gas sensing result may be the digital code N-bit Output indicating a ratio of the frequency of each of the oscillating signals F1 through Fk to the frequency of the reference clock signal CLK, and for example, the digital code N-bit Output may have a value corresponding to (Fk/P)/(Fext/M).

Meanwhile, referring to FIG. 16, a component for removing an effect of random noise when a large amount of noise is introduced to the gas sensing system 700 is included in the gas sensing system 700. Accordingly, the gas sensing system 700 may further include, in addition to components shown in FIG. 15, a frequency divider 750 for noise averaging of an output from the frequency counting logic 720. According to some example embodiments, the frequency divider 750 may divide a signal output from the frequency counting logic 720 by 1/L, and generate, as a gas sensing result, i.e., the digital code N-bit Output, a result obtained by dividing the signal output from the frequency counting logic 720 by 1/L.

A noise value may be reduced by 1/sqrt(L) according to dividing characteristics of the frequency divider 750 connected to an output terminal of the frequency counting logic 720. Also, the digital code N-bit Output may have a value corresponding to [(Fk/P)/(Fext/M)]/L. According to some example embodiments, a section where the frequency counting logic 720 performs a counting operation may be set longer than the previous embodiments, and the digital code N-bit Output having the same value as the previous embodiments may be generated by dividing an output (for example, a digital code) of the frequency counting logic 720.

Meanwhile, each of a plurality of FBAR sensors (for a plurality of oscillators) included in the gas sensing system 700 may have an error while a semiconductor chip is mass-produced. For example, when a large amount of semiconductor chips (or the gas sensing systems 700) including FBAR sensors are mass-produced, the FBAR sensors that have the same resonance frequency characteristics may have an error between the semiconductor chips. For example, a digital code value corresponding to 100 needs to be generated when a gas of certain concentration is sensed by a first FBAR sensor sensing a first type of gas, but a digital code value having an error may be generated by a semiconductor chip due to an error generated by mass-production of semiconductor chips.

Referring to FIG. 17, the gas sensing system 700 may further include, in addition to components shown in FIG. 16, a data processing block 760 for a post-process operation performed on the digital code N-bit Output. In FIG. 17, the data processing block 760 is added to the gas sensing system 700 of FIG. 16, but some example embodiments is not limited thereto. For example, the data processing block 760 may be added to any one of gas sensing systems described above. The data processing block 760 may be implemented by one or more instances of circuitry, including a processor executing a program of instructions stored in a memory. For example, the memory may include a volatile or non-volatile computer readable storage medium, and the processor may include a CPU, ASIC, some combination thereof, or the like.

Meanwhile, in FIG. 17, the data processing block 760 is embodied as hardware at the rear end of the frequency counting logic 720 and the frequency divider 750, but some example embodiments is not limited thereto. For example, software programs for correcting an error of an FBAR sensor may be stored in a certain working memory (not shown), and the gas sensing system 700 may perform an error correction operation on an output of the frequency counting logic 720 or an output of the frequency divider 750 via a software manner.

An error of an FBAR sensor (or an oscillator) may be variously generated. For example, the error of the FBAR sensor (or the oscillator) may be generated according to mismatch components, such as a frequency offset, a gain error, and a temperature characteristic. Such a mismatch component may be measured under a certain reference environment, and reference information according to a result of the measurement may be stored in the data processing block 760. The data processing block 760 may correct the error by using the stored reference information, and generate the corrected digital code N-bit Output.

Figure 18:
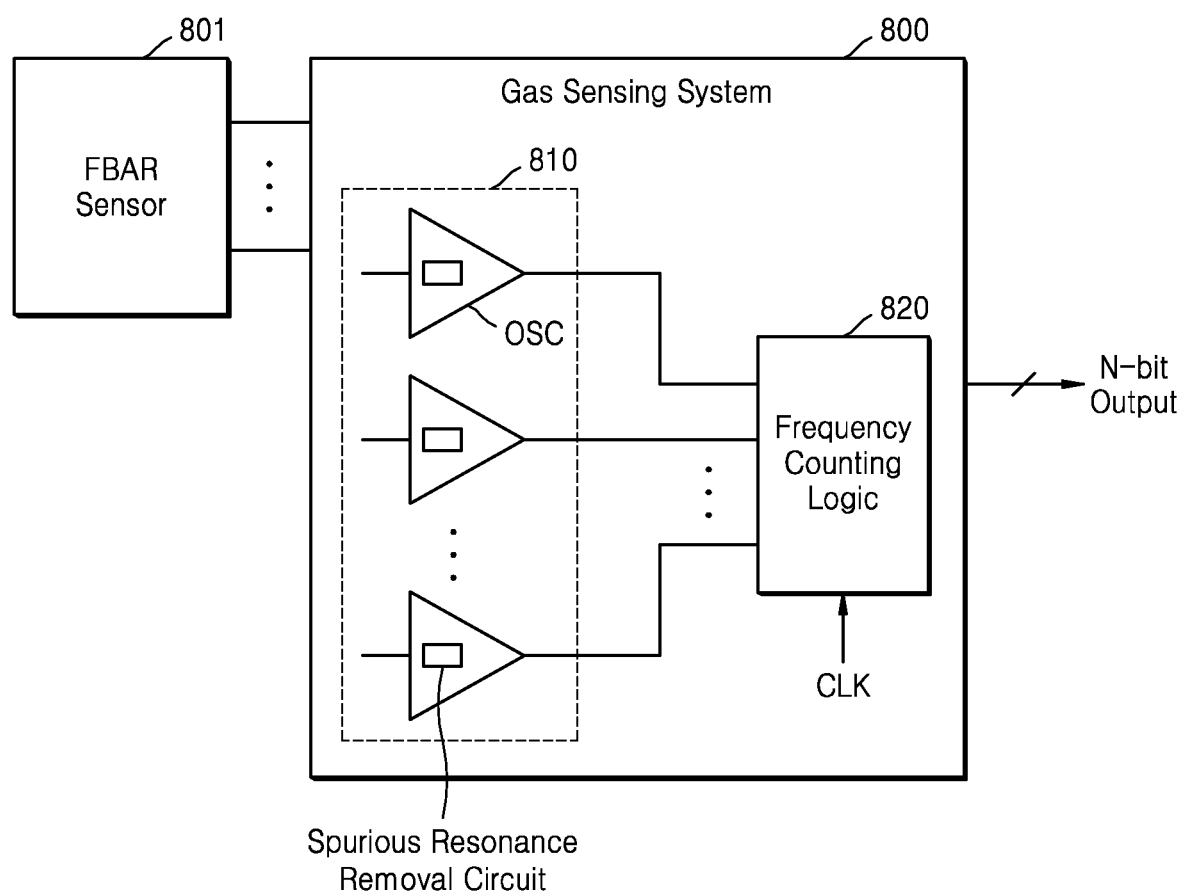
FIG. 18 is a block diagram of a gas sensing system to which a spurious resonance removal circuit is applied, according to some example embodiments.

FIG. 18 is a block diagram of a gas sensing system 800 to which a spurious resonance removal circuit is applied, according to some example embodiments. As described herein, a gas sensing system 800 may be implemented by one or more instances of circuitry, including a processor executing a program of instructions stored in a memory. For example, the memory may include a volatile or non-volatile computer readable storage medium, and the processor may include a CPU, ASIC, some combination thereof, or the like.

Referring to FIG. 18, the gas sensing system 800 may be connected to an external sensor block 801 including at least one FBAR sensor, and as described above, the gas sensing system 800 and the sensor block 801 may be electrically connected to each other through a conductive line, such as a bonding wire, and spurious resonance may be generated by the conductive line. A plurality of FBAR sensors, in some example embodiments, may be located external to the gas sensing system 800.

An oscillator block 810 includes a plurality of oscillators, and as described above, may output oscillating signals having frequencies changing according to changes of resonance frequencies of the FBAR sensors in the sensor block 801. Also, the oscillator block 810 may include a spurious resonance removal circuit so as to remove spurious resonance, and as described above, at least one circuit device formed on or connected to an oscillating path in each oscillator may be provided.

The frequency counting logic 520 may receive oscillating signals from which spurious resonance is removed, and generate a gas sensing result, i.e., the digital code N-bit Output based on operation processes performed on the reference clock signal CLK and the oscillating signals. Since oscillation in an unintended frequency domain caused by spurious resonance may be limited and/or prevented, accuracy of the digital code N-bit Output from the gas sensing system 800 may be increased.

An electronic nose system or a semiconductor chip including the electronic nose system, according to one or more embodiments, may sense various types of gases by using various types of polymers, and thus may be used for various purposes. For example, the electronic nose system according to some example embodiments may be used for various purposes, such as for an air quality detecting sensor for a mobile device, a noxious environment material detecting sensor, a home appliance sensor for sensing decomposition of food or the like, and for mobile breathalyzer.

While the inventive concepts have been particularly shown and described with reference to embodiments thereof, it will be understood that various changes in form and details may be made therein without departing from the spirit and scope of the following claims.

What is claimed is:

1. An oscillator electrically connected to an external resonator through a conductive line, the oscillator comprising:
   a first cross-coupled amplifier including a first transistor having a gate connected to a first output terminal of the oscillator and a second transistor having a gate connected to a second output terminal of the oscillator, the first cross-coupled amplifier configured to establish an oscillating path; and
   a spurious resonance removal circuit including at least one circuit device on the oscillating path in the first cross-coupled amplifier, the spurious resonance removal circuit configured to remove spurious resonance caused by the conductive line,
   wherein the oscillating path includes a first oscillating path between the gate of the first transistor and the first output terminal, wherein the spurious resonance removal circuit includes a first resistor between the gate of the first transistor and the first output terminal, wherein the spurious resonance removal circuit further includes a first capacitor, the first capacitor including one end connected to a node between the gate of the first transistor and the first resistor, the first capacitor including an opposite end connected to a ground independently of any connection to the first output terminal of the oscillator.

2. The oscillator of claim 1, wherein, the oscillating path further includes a second oscillating path between the gate of the second transistor and the second output terminal, and the spurious resonance removal circuit further includes a second resistor between the gate of the second transistor and the second output terminal.

3. The oscillator of claim 2, wherein the spurious resonance removal circuit further includes a second capacitor, the second capacitor having one end connected to a node between the gate of the second transistor and the second resistor, the second capacitor including an opposite end connected to the ground independently of any connection to the second output terminal of the oscillator.

4. The oscillator of claim 1, further comprising:

a second cross-coupled amplifier electrically connected to the first cross-coupled amplifier;

a third transistor including a gate connected to the first output terminal; and a fourth transistor including a gate connected to the second output terminal;

wherein the first and second transistors are one of NMOS and PMOS transistors, and the third and fourth transistors are a separate one of NMOS and PMOS transistors.

5. The oscillator of claim 4, wherein the spurious resonance removal circuit further includes at least one circuit device on an oscillating path in the second cross-coupled amplifier.

6. The oscillator of claim 5, wherein the at least one circuit device on the oscillating path in the second cross-coupled amplifier includes a second resistor between the gate of the third transistor and the first output terminal; and a third resistor between the gate of the fourth transistor and the second output terminal.

7. A device, comprising:

an oscillator configured to be electrically connected to an external resonator through a conductive line, the oscillator configured to generate an oscillating signal having a frequency corresponding to a resonance frequency of the external resonator; and a spurious resonance removal circuit configured to remove spurious resonance caused by the conductive line from the oscillating signal, such that the frequency of the oscillating signal is within a particular frequency range, wherein the oscillator includes a first oscillating path between a gate of a first transistor and a first output terminal, wherein the spurious resonance removal circuit includes a first resistor between the gate of the first transistor and the first output terminal.

8. The device of claim 7, further comprising:

the oscillator is configured to generate the oscillating signal to have a frequency corresponding to a particular gas sensed by the external resonator; and the device further includes a frequency counting logic including one or more instances of circuitry, the frequency counting logic configured to receive a reference clock signal and the oscillating signal generated by the oscillator, perform a counting operation on the oscillating signal according to a logic state of the reference clock signal to generate a counted value, and generate a gas sensing output based on the counted value, the gas sensing output indicating that the particular gas is sensed.

9. The device of claim 8, wherein the performing the counting operation includes performing an AND operation on the oscillating signal and the reference clock signal, and performing the counting operation on a signal according to a result of performing the AND operation.

10. The device of claim 7, wherein the spurious resonance removal circuit is configured to remove the spurious resonance based on performing low pass filtering in the oscillator.

* * * * *